United States Patent
Ahn et al.

(10) Patent No.: US 11,257,710 B2
(45) Date of Patent: Feb. 22, 2022

(54) METHOD OF FABRICATING SEMICONDUCTOR DEVICE

(71) Applicant: XIA TAI XIN SEMICONDUCTOR (QING DAO) LTD., Qingdao (CN)

(72) Inventors: Woo-Song Ahn, Singapore (SG); Yongchul Oh, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/739,128

(22) Filed: Jan. 10, 2020

(65) Prior Publication Data
US 2021/0217657 A1 Jul. 15, 2021

(51) Int. Cl.
*H01L 21/308* (2006.01)
*H01L 21/768* (2006.01)
*H01L 27/108* (2006.01)
*H01L 21/311* (2006.01)

(52) U.S. Cl.
CPC ...... *H01L 21/76802* (2013.01); *H01L 21/308* (2013.01); *H01L 27/10882* (2013.01); *H01L 21/31144* (2013.01)

(58) Field of Classification Search
CPC ............. H01L 21/76802; H01L 21/308; H01L 27/10882; H01L 21/76811; H01L 21/0337; H01L 21/31144

USPC ........ 438/694, 706, 714, 717, 719, 723, 736
See application file for complete search history.

(56) References Cited

U.S. PATENT DOCUMENTS

| | | | |
|---|---|---|---|
| 2014/0252458 A1* | 9/2014 | Sung | H01L 27/10876 257/329 |
| 2016/0365276 A1* | 12/2016 | Wu | H01L 21/02115 |
| 2018/0174904 A1* | 6/2018 | Hsieh | H01L 29/785 |

* cited by examiner

*Primary Examiner* — Lan Vinh
(74) *Attorney, Agent, or Firm* — ScienBiziP, P.C.

(57) ABSTRACT

A method comprises: disposing an ashing resistive layer over a multi-layered mask; sequentially disposing a first and second dummy layer on the ashing resistive layer; sequentially forming a first pattern structure and a second pattern structure there-over over the second dummy layer; recessing the second dummy layer, through the first and the second pattern structure, to partially expose the first dummy layer and to form a target pattern structure defining a target pattern; performing an anisotropic etching process, through the target pattern structure, to recess the exposed portions of the first dummy layer such that the target pattern is transferred to the recessed first dummy layer; performing an ashing process to remove the target pattern structure; and performing a pattern transferring process by recessing the ashing resistive layer and the multi-layered mask through the recessed first dummy layer to transfer the target pattern to the multi-layered mask.

19 Claims, 29 Drawing Sheets

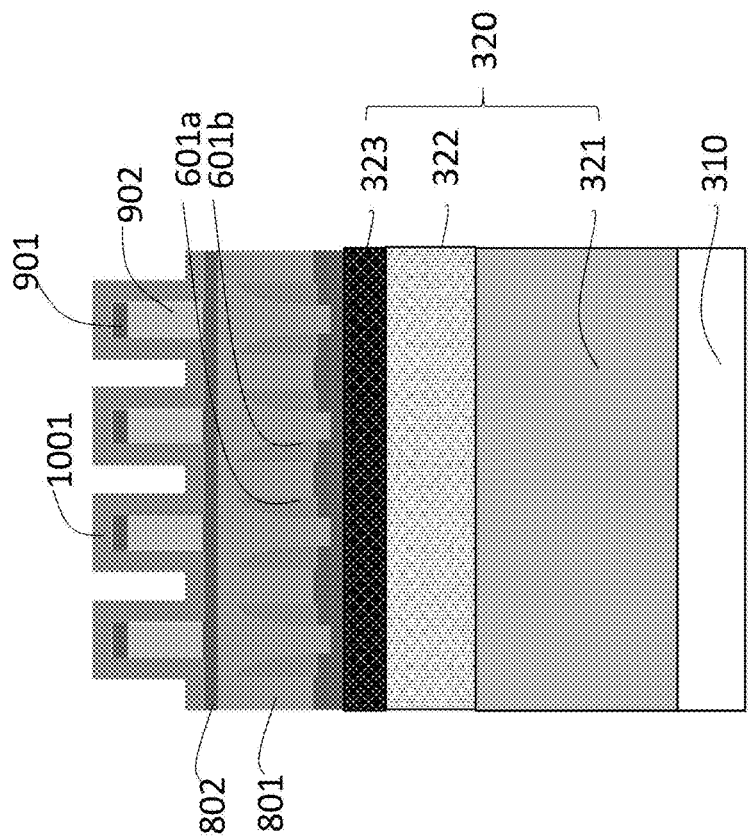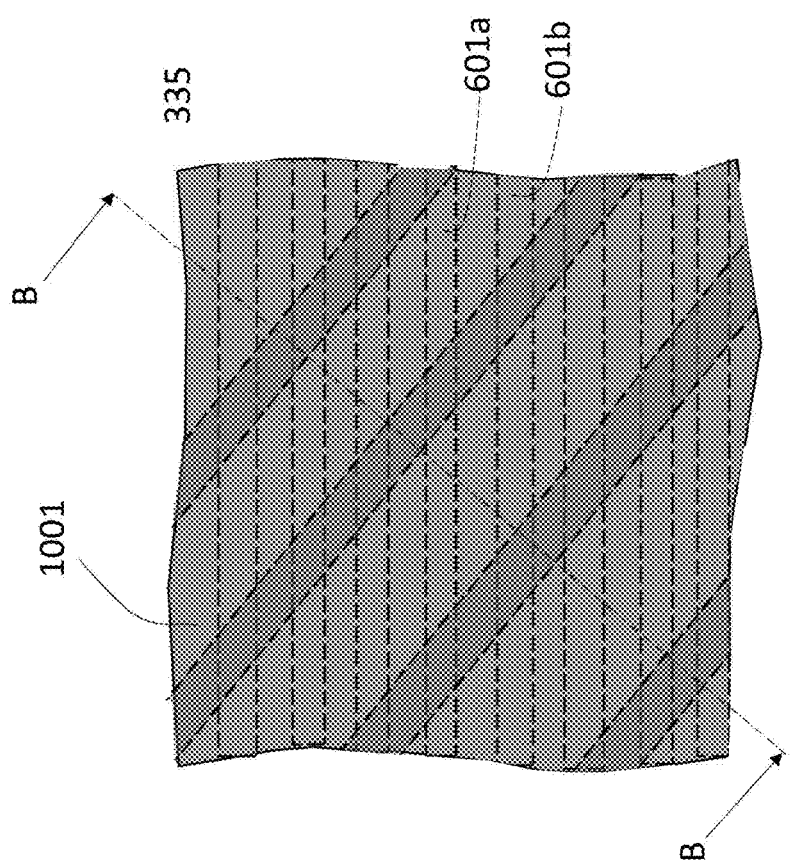
FIG. 10B
FIG. 10A

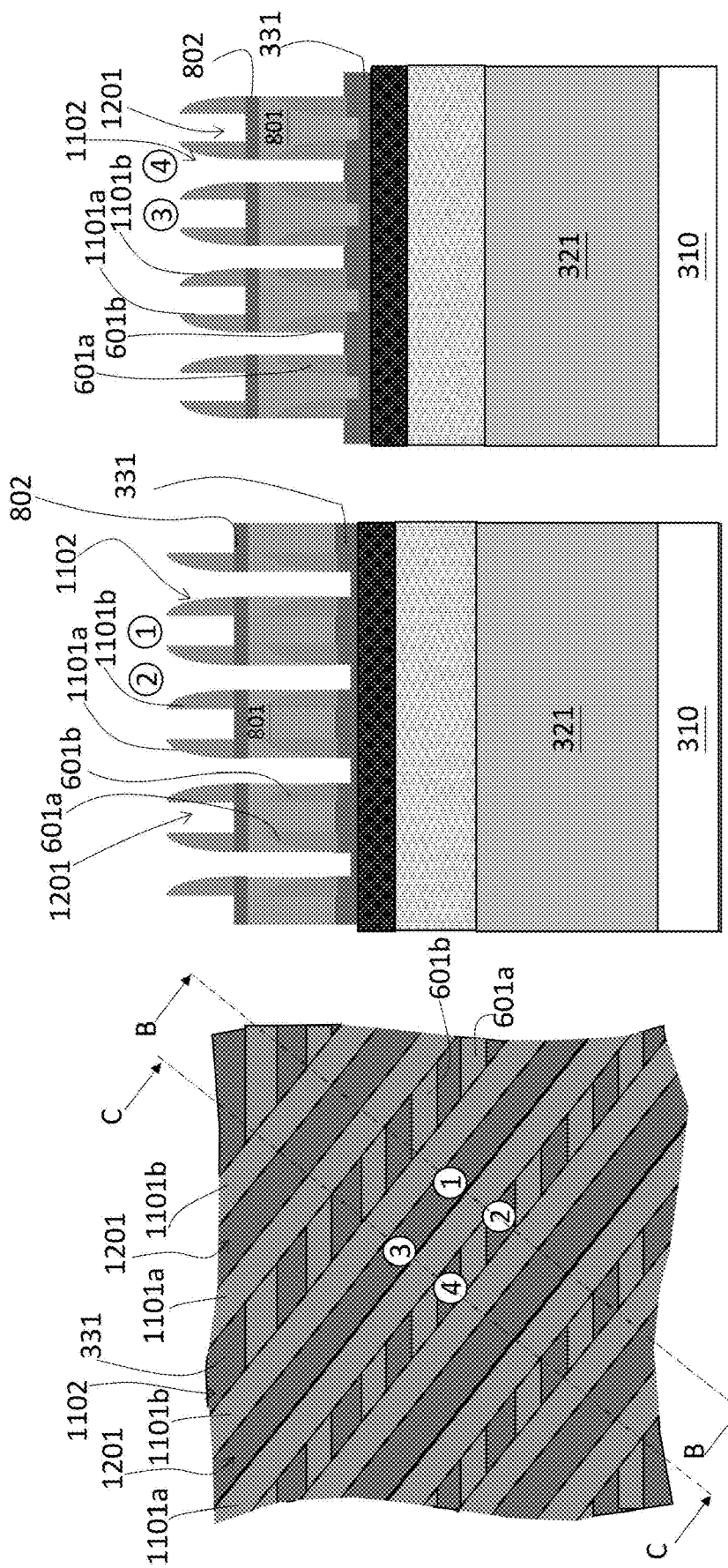

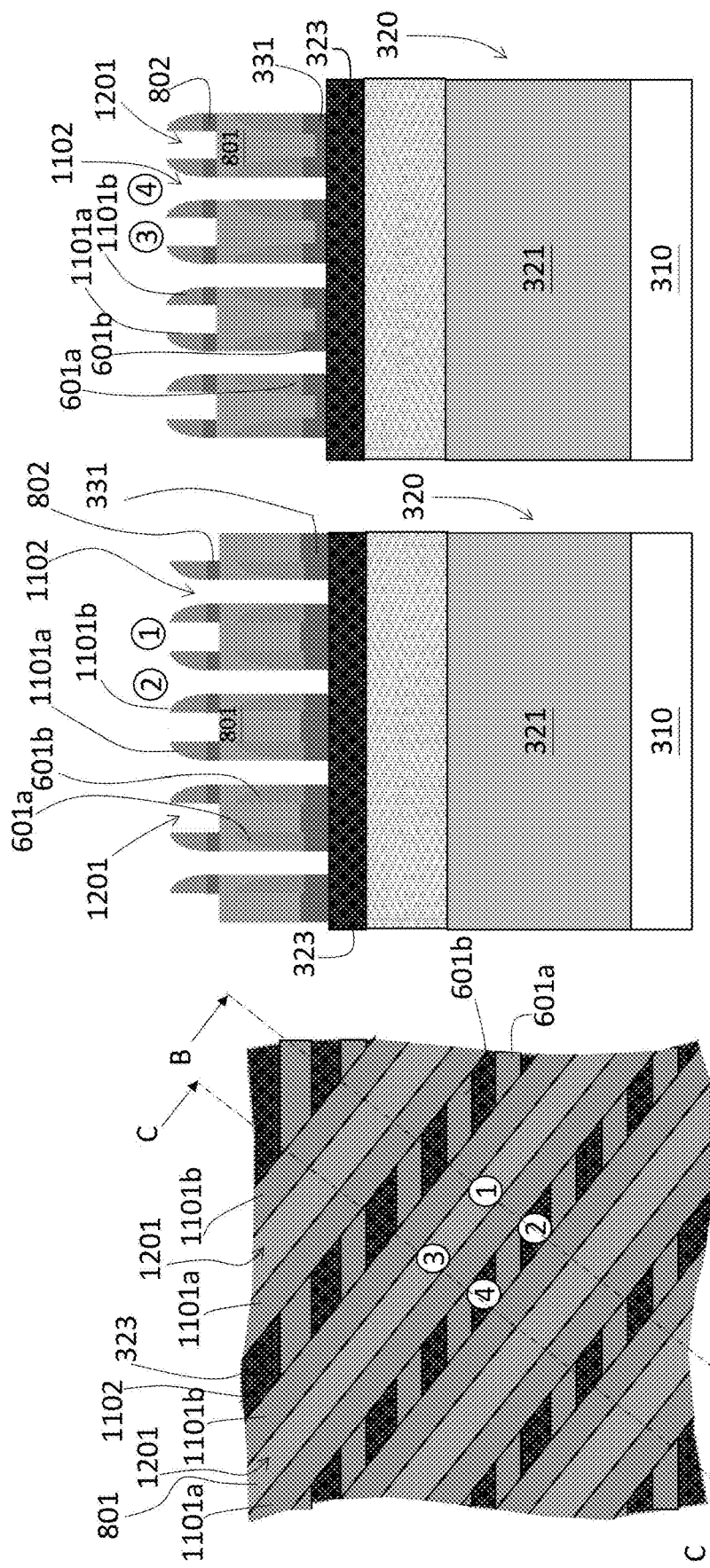

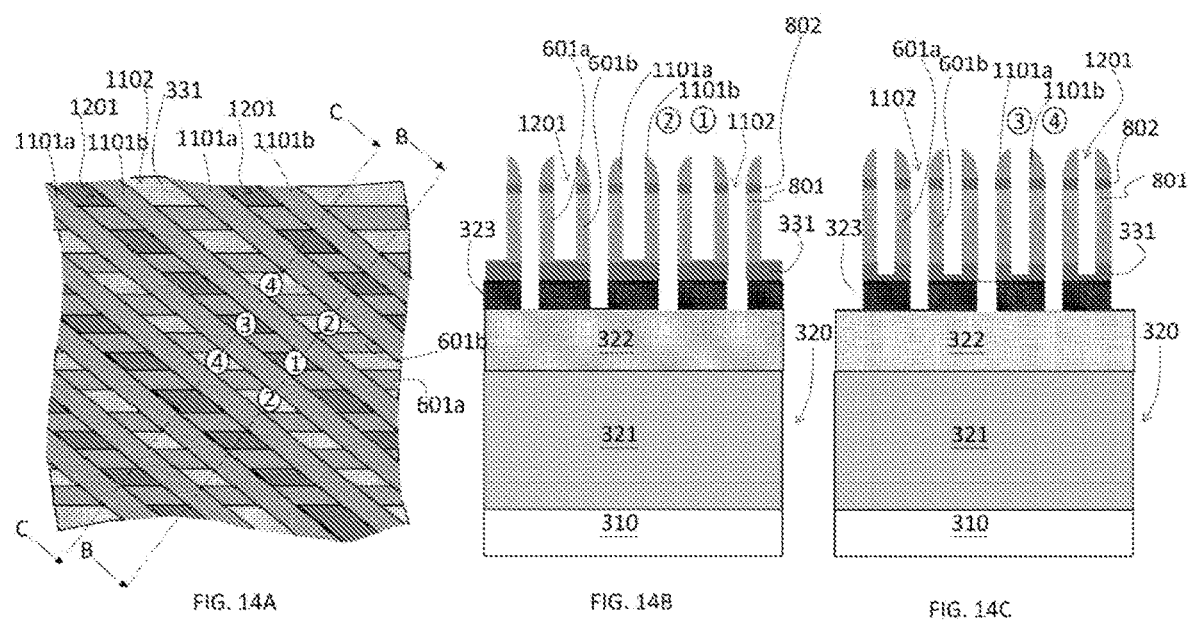

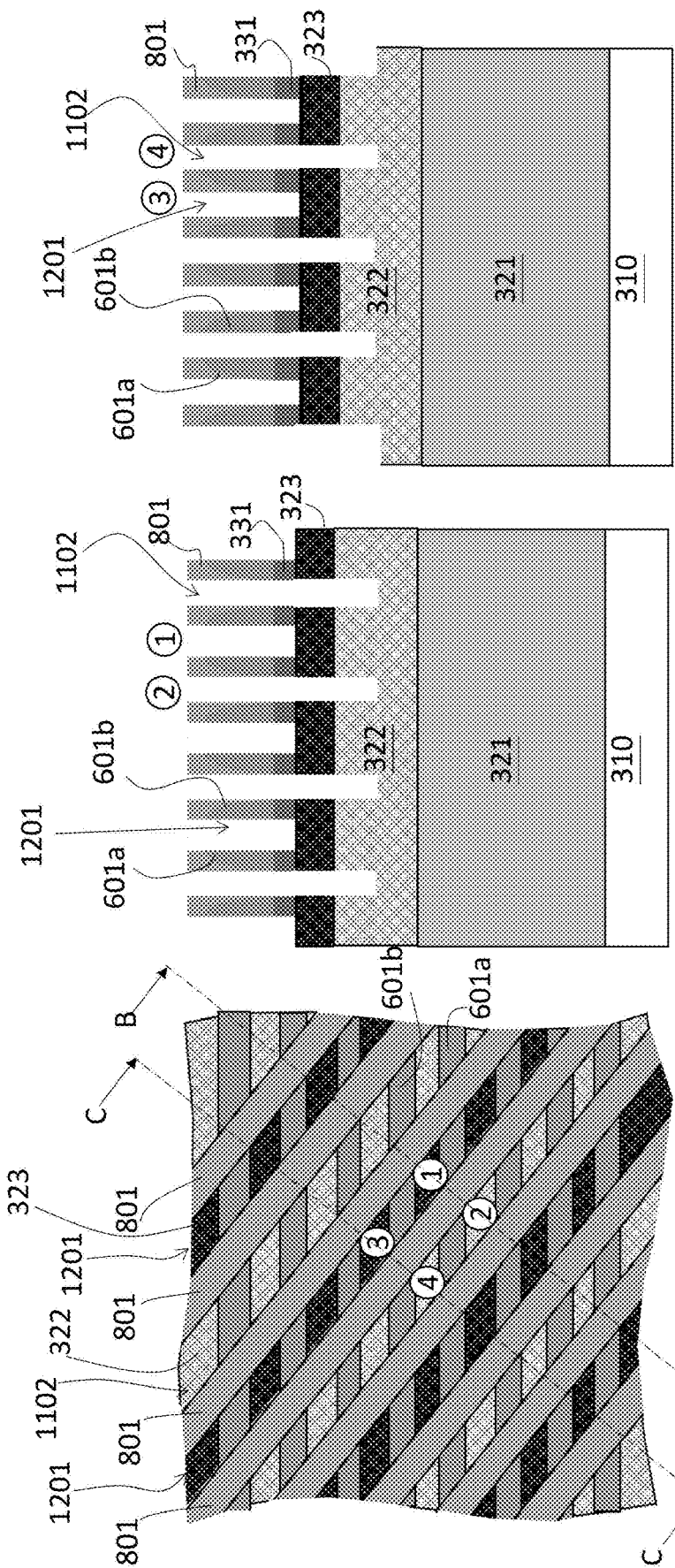

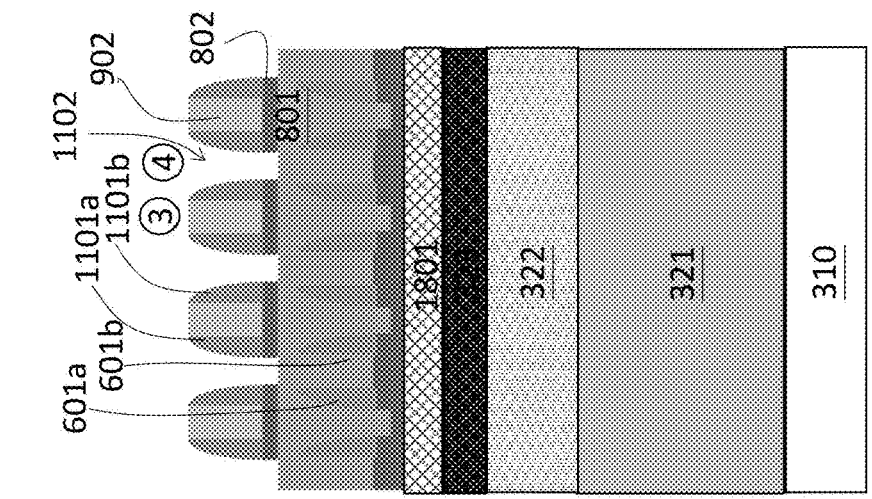
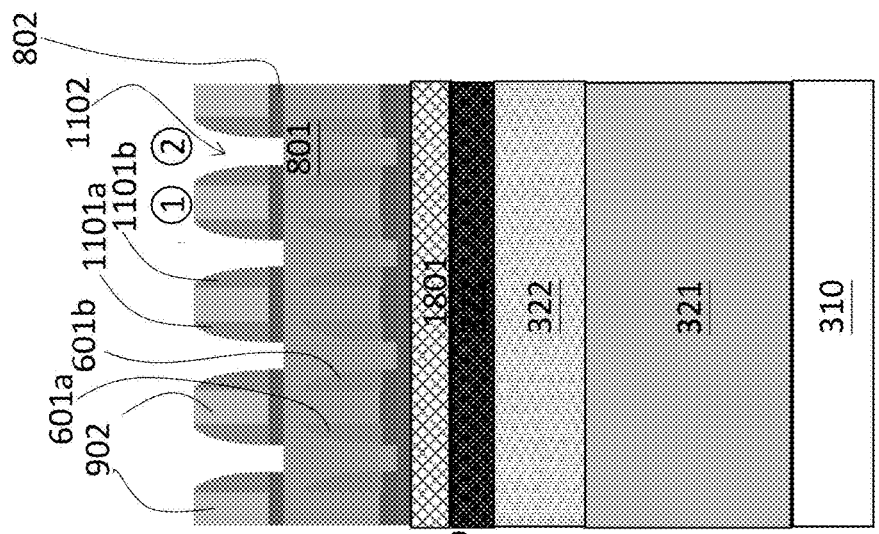
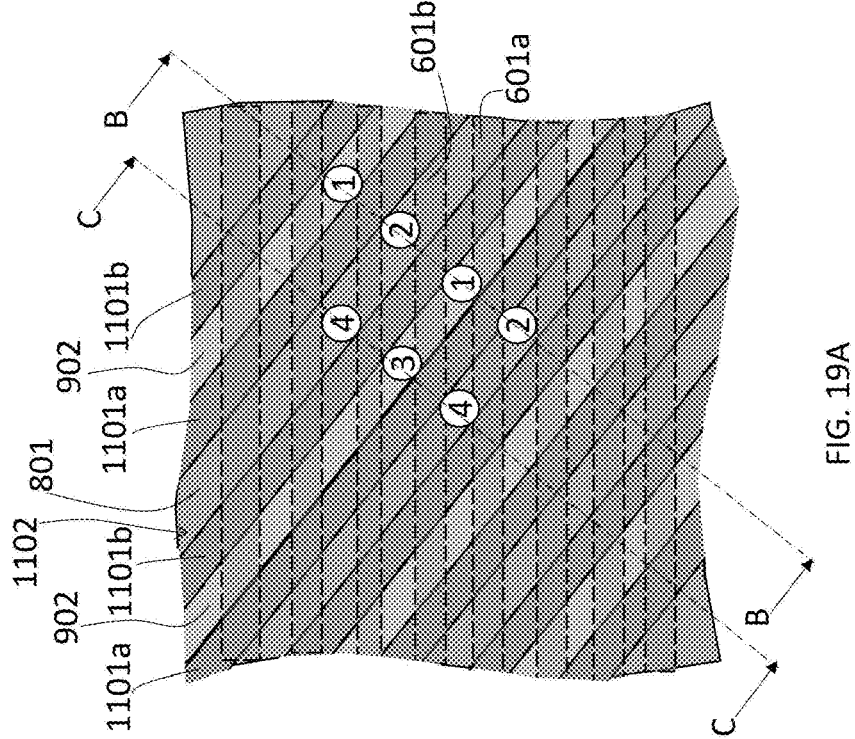
FIG. 19C
FIG. 19B
FIG. 19A

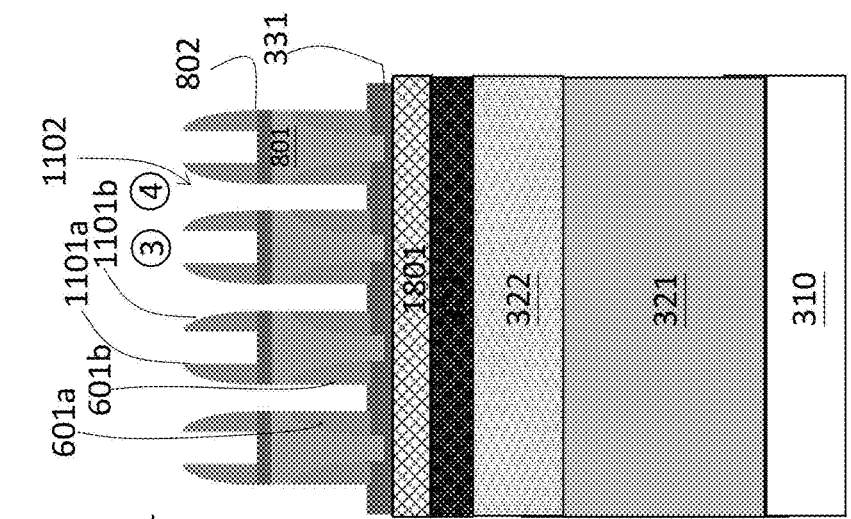
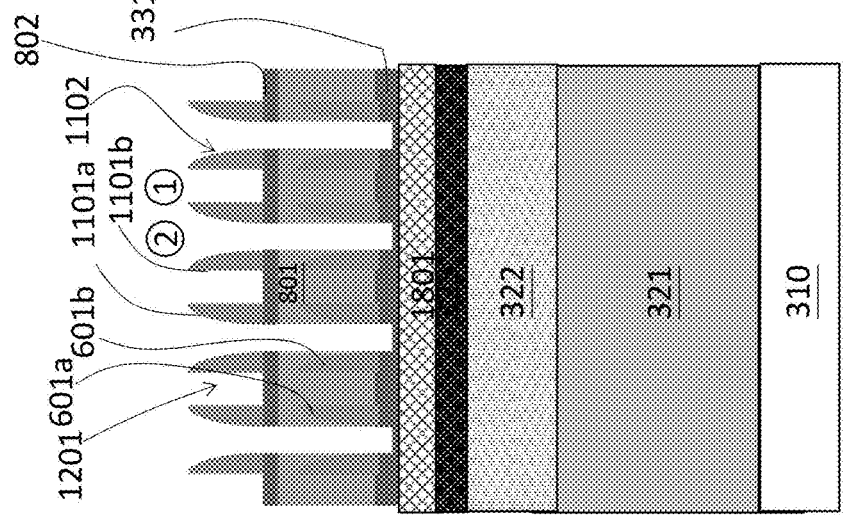
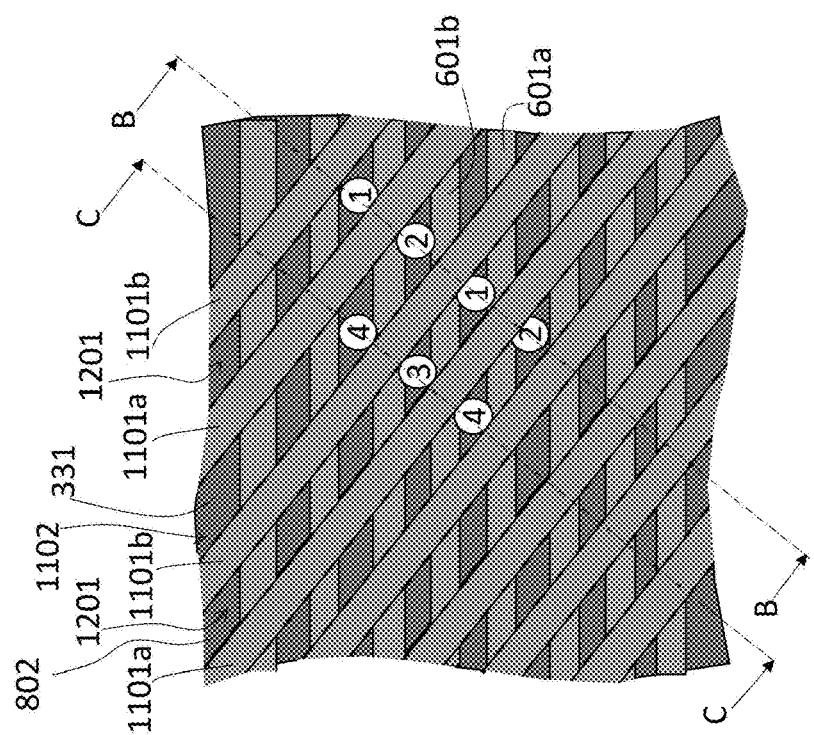

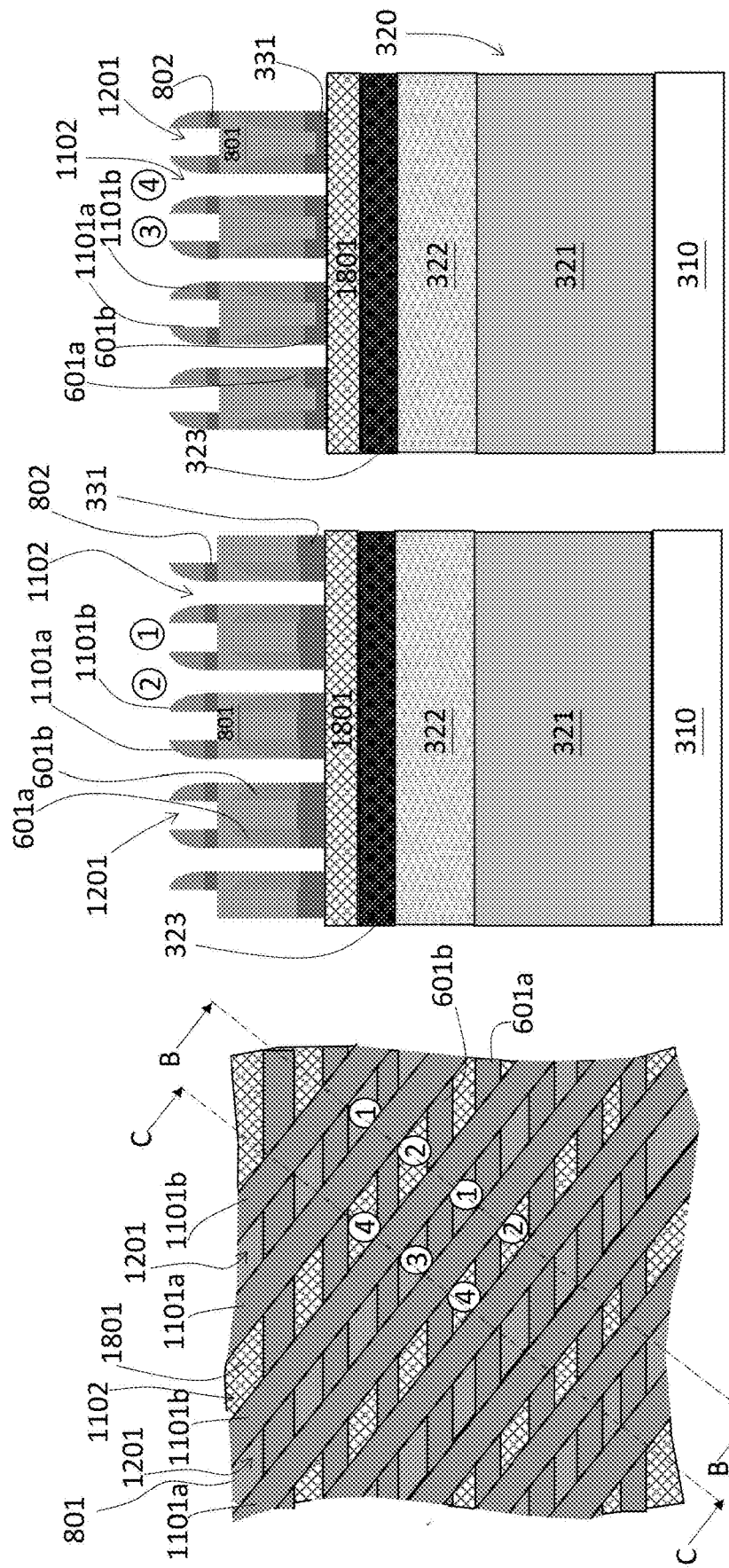

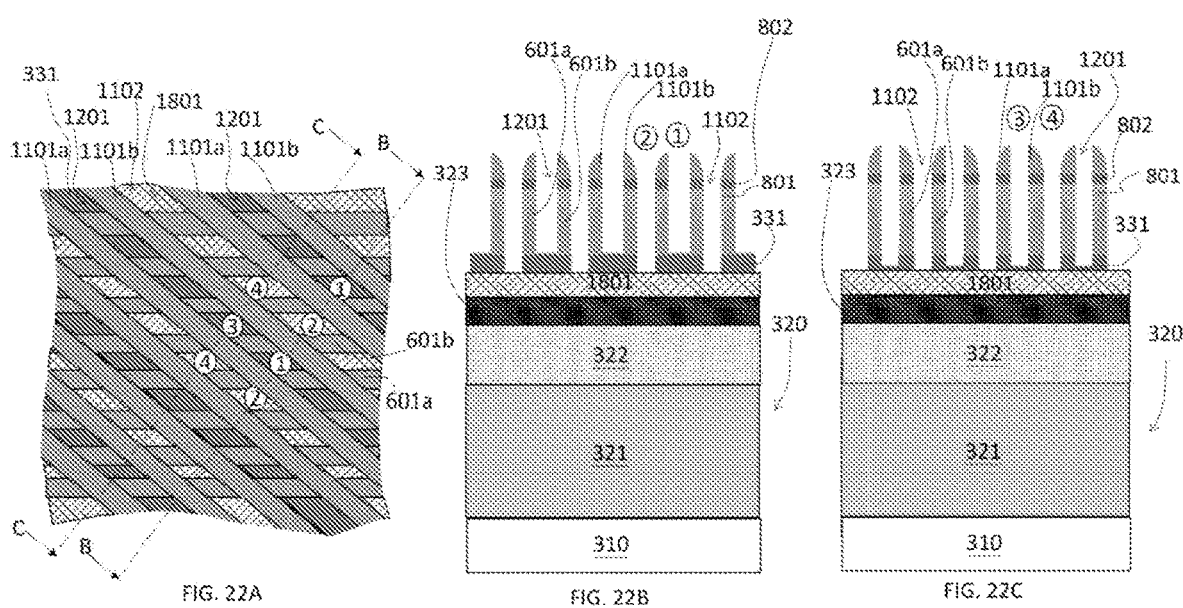

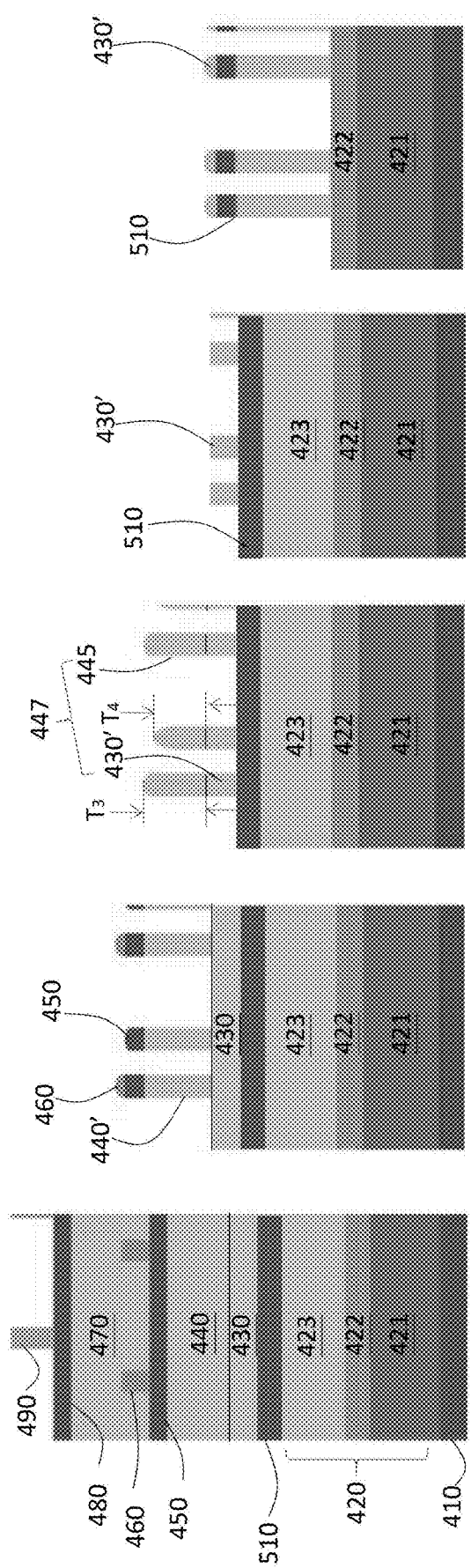

METHOD OF FABRICATING SEMICONDUCTOR DEVICE

FIELD

The present disclosure generally relates to method of fabricating semiconductor device, more specifically to method utilizing double patterning technique.

BACKGROUND

Modern integrated circuits (IC) are designed to encompass millions of components such as transistors, capacitors, resistors with high device density. The demand for higher degree of horizontal integration may be achieved through performing certain patterning technique. By ways of example, double patterning technique may be applied in the formation of line features, spacer features, contact features, and/or recess features in memory devices such as Dynamic random-access memory (DRAM).

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A, 4A, 5A, 6A, 7A, 8A, 9A, 10A, 11A, 12A, 13A, 14A, 15A, 16A, 17A illustrate plane views of intermediate stages of fabricating semiconductor device in accordance with some embodiments of the instant disclosure.

FIGS. 3B, 4B, 5B, 6B, 7B, 8B, 9B, 10B, 11B, 12B, 13B, 14B, 15B, 16B, 17B illustrate cross section views of intermediate stages of fabricating semiconductor device in accordance with some embodiments of the instant disclosure.

FIGS. 11C, 12C, 13C, 14C, 15C, 16C, 17C illustrate cross section views of intermediate stages of fabricating semiconductor device in accordance with some embodiments of the instant disclosure.

FIGS. 18A, 19A, 20A, 21A, 22A, 23A, 24A, 25A illustrate plane views of intermediate stages of fabricating semiconductor device in accordance with some embodiments of the instant disclosure.

FIGS. 18B, 19B, 20B, 21B, 22B, 23B, 24B, 25B and 19C, 20C, 21C, 22C, 23C, 24C, 25C illustrate cross section views of intermediate stages of fabricating semiconductor device in accordance with some embodiments of the instant disclosure.

FIGS. 34-38 illustrate cross section views of intermediate stages of fabricating semiconductor device in accordance with some embodiments of the instant disclosure.

Figure 1:
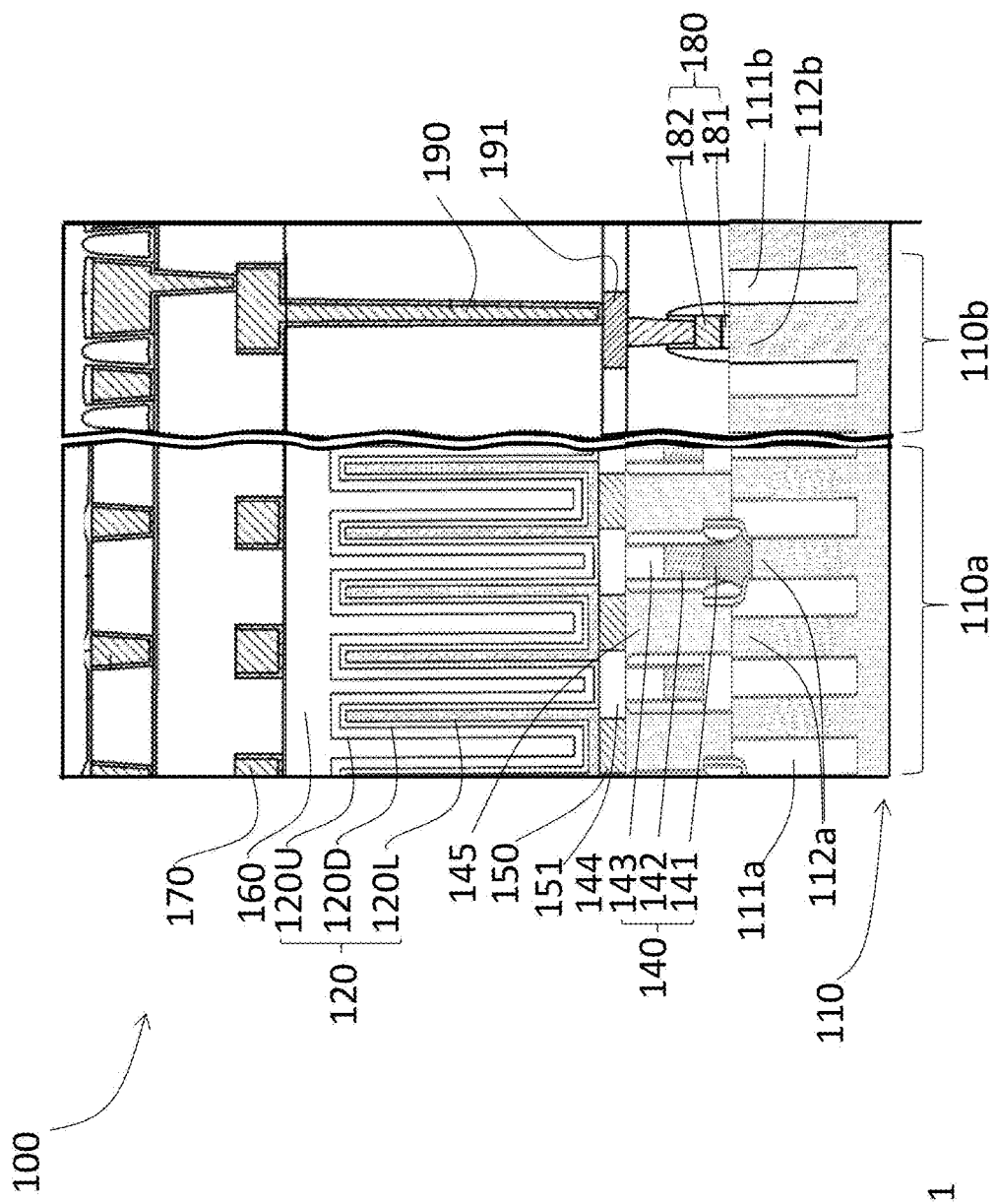
FIG. 1 illustrates a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 38. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a regional cross-sectional view of a semiconductor device 100 in accordance with the instant disclosure. For illustrational simplicity and clarity, some detail/sub components of the exemplary device are not explicitly labeled in the instant figure. The illustrative embodiment of the semiconductor device 100 may be, for example, a Dynamic Random Access Memory (DRAM) device.

The exemplary semiconductor device 100 comprises a semiconductor substrate 110 and multiple layers of integrated circuit devices and features formed on the substrate 110. Several functional regions may be arranged laterally (e.g., horizontally across the page as shown in FIG. 1) over the substrate 110. By way of example, FIG. 1 shows a substrate of an exemplary device that includes two co-planar arranged functional regions defined thereon, e.g., a cell region 110a and a periphery region 110b.

The substrate 110 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 110 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a semiconductor-on-insulator (SOI) structure, such as a silicon-on-insulator (SOI) structure, SiGe-on insulator (SiGeOI), Ge on insulator (GeOI) and the like.

The periphery region 110b may comprise various active device regions 112b laterally separated by isolation features, such as shallow trench isolation (STI) 111b. The active region 112b may comprise an active circuit component (e.g., a gate structure 180) that make up the periphery support circuits, e.g., read-out, decoder, or amplifier circuits that controlling memory cells formed in the cell region. Over the active region there may be one or more upper inter device layers, through which contact via 190 may be provided to enable vertical signal conduction (e.g., from the gate structure 180) to a higher device layer. The contact via 190 may be connected to a corresponding contact pad 191 in a fashion similar to that in the cell region 110a. The gate structure 180 may including a gate dielectric 181 on an active region and a gate conductor 182 on the gate dielectric 181.

The cell region 110a may comprise various active device regions 112a laterally separated by isolation features, such as STI 111b.

In the illustrated embodiment, array of memory unit cells may be formed in the cell region 110a of the substrate 110. Each of the memory cell units typically includes a storage element (such as capacitor 120) and a selection device (not shown) such as a transistor.

In the exemplary embodiment, a capacitor 120 includes a lower electrode 120L, a capacitor dielectric 120D lining on the lower electrode 120L, and an upper electrode 120U filling the gaps between the lower electrodes 120L.

In some embodiments, the lower electrode 120L may be a cylindrical or pillar-shaped conductive structure having high aspect ratio (i.e., high depth to width ratio), which corresponds to a tall upward opening U-shaped cross sectional profile (as shown the instant example). The lower electrode 120L may be formed from a conformal conductive film made of one or more conductive material(s) such as BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 120D may be a conformally formed layer that comprises a nitride, an oxide, a metal oxide, or a combination thereof. For example, the capacitor dielectric 120D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 120U may be formed of one or more conductive material such as doped semiconductor, conductive metal nitride, metal, metal silicide, conductive oxide, or a combination thereof. For instance, the upper electrode 120U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

In the illustrated embodiment, an interlayer insulating layer 160 is formed to cover capacitors (e.g., capacitors 120) over the cell region 110a. Additional conductive features, such as upper metallization feature 170 and additional inter metal dielectric layers may be formed over the interlayer insulating layer 160 and the upper electrode 120U to enable interconnection between circuit elements.

In the illustrated embodiment, several bit line (BL) stack features 140 are formed over the cell region 110a. In practical applications, the BL stack features 140 may be a laterally traversing linear structure (e.g., extending in/out of the page of, e.g., FIG. 1) that projectively intercepts multiple word lines. Each of the BL stack features 140 comprises a BL contact 141, a BL conductor 142, and a BL capping 143. The BL conductor 142 is part of a memory cell selection device that electronically connect to an active region 112a that serve as a source of a selection device through the BL contact 141. The BL contact 141 may be made of conductive material such as poly silicon, metal, or metal silicide. The BL conductor 142 may include conductive material such as poly silicon, metal, or metal silicide.

Although not shown in the cross-sectional diagram illustrated in FIG. 1, a word line may be part of a memory cell selection device. In practical applications, the word line may be a linear structure that projectively intercepts multiple bit lines (e.g., BL stack features 140).

A storage node contact 145 establishes a vertical conductive path connecting the lower electrodes 120L of the capacitors 120 and top surface of active region 112a of the substrate 110 under the lower electrodes 120L. The storage node contacts 145 may be formed by depositing a layer of polysilicon, metal, metal silicide, or metal nitride. Alternatively, the storage node contacts 145 may be formed by forming an epitaxial silicon layer. Differently, the storage node contacts 145 may be formed by forming an epitaxial silicon layer and depositing a metal layer.

A landing pad 150 may be additionally formed to electrically connect the lower electrode 120L to the storage node contact 145. In addition, a landing pad insulating layer 151 may be formed to electrically separate the landing pads 150 from each other.

Figure 2A:
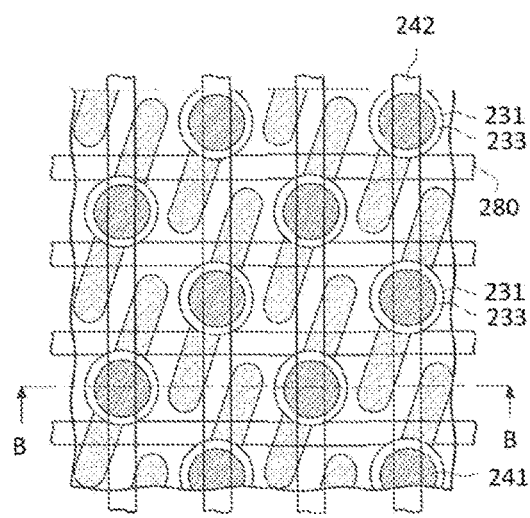
FIGS. 2A and 2B illustrate plane view and cross section view of an intermediate stage of fabricating semiconductor device in accordance with some embodiments of the instant disclosure.
Figure 2B:
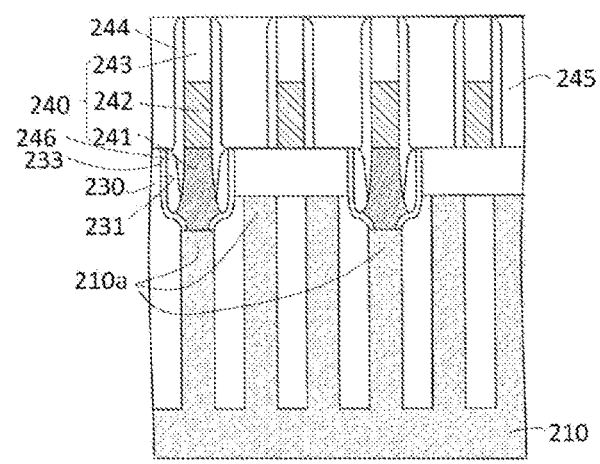

FIGS. 2A and 2B illustrate a plane view and a cross section view of an intermediate stage of fabricating semiconductor device in accordance with some embodiments of the instant disclosure. In particular, FIG. 2B shows a cross section view taken along a cut-line B-B indicated in FIG. 2A.

A substrate 210 may be formed to have active regions 210a. The active regions 210a may have a substantially vertical pillar structure in a cross section (as illustrated in FIG. 2B). Bit line contact holes 231 may be formed. For example, the formation of the bit line contact holes 231 may include forming a interlayer insulating layer 230 and patterning it to expose the active regions 210a.

Insulating liners 233 may be formed in the bit line contact holes 231, respectively. The formation of the insulating liners 233 may include depositing an insulating material (e.g., a silicon oxide layer or a silicon nitride layer) and performing a spacer-forming process including an anisotropic etching step. Each of the insulating liners 233 may cover an inner sidewall of the bit line contact hole 231 and expose top surface of the active region 210a there-under. In some embodiments, the formation of the insulating liners 233 may be omitted.

A bit line stack feature 240 may be formed at a bit line contact hole 231 and electrically connects the corresponding one of the active regions 210a.

For example, the first process of the formation for the bit line stack features 240 may be sequentially disposing a first conductive layer over the substrate 210 and filling the bit line contact hole 231, a second conductive layer over the first conductive layer, and an insulation layer over the first conductive layer. Later, the insulation layer maybe patterned to form a plurality of linear-shaped capping 243. Then, the second and the first conductive layers may be sequentially or concurrently recessed through the capping 243. As such, a bit line stack feature 240 is formed. To be particular, a bit line contact 241 connecting the corresponding active region 210a and a bit line 242 electrically connected to the bit line contact 241 are formed under the capping 243. Each of the bit lines 242 may be patterned into a linear shape and projectively intercepts with several word lines 280. Adjacent ones of the bit lines 242 may be spaced apart from each other. In some embodiments, the first conductive layer may comprise poly silicon. The second conductive layer may comprise conductive material such as tungsten. The insulation layer may comprise silicon nitride. In some embodiments, the first conductive layer may comprise conductive material such as poly silicon, metal, or metal silicide. The second conductive layer may comprise conductive material such as poly silicon, metal, or metal silicide.

An insulating liner (e.g., a silicon oxide layer or a silicon nitride layer) covering the bit line stack feature (e.g., bit line stack features 240) may be deposited and patterned to form pairs of bit line spacer 244 respectively covering side surfaces of bit line stack features. During the formation of the bit line spacers 244, lower spacers 246 may be formed in the bit line contact holes 231, respectively. Several lower spacers 246 may be formed concurrently or by individual processes. Next, a silicon oxide layer or a silicon nitride layer may be deposited to form an interlayer insulating layer 245 that fills gaps between the pairs of bit line spacers 244.

Figure 2C:
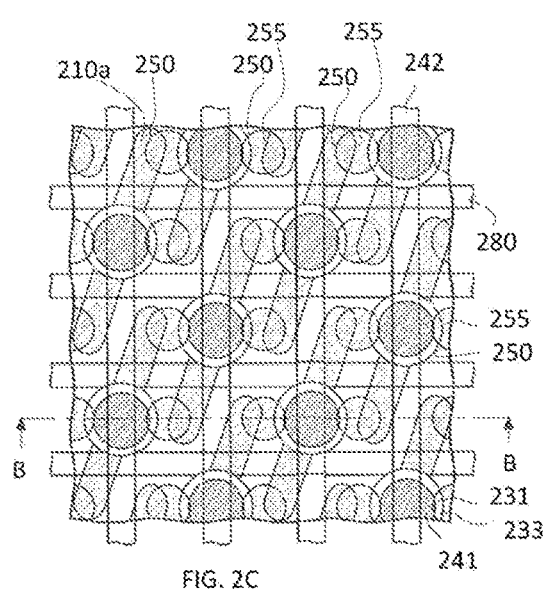
FIGS. 2C and 2D illustrate plane view and cross section view of an intermediate stage of fabricating semiconductor device in accordance with some embodiments of the instant disclosure.
Figure 2D:
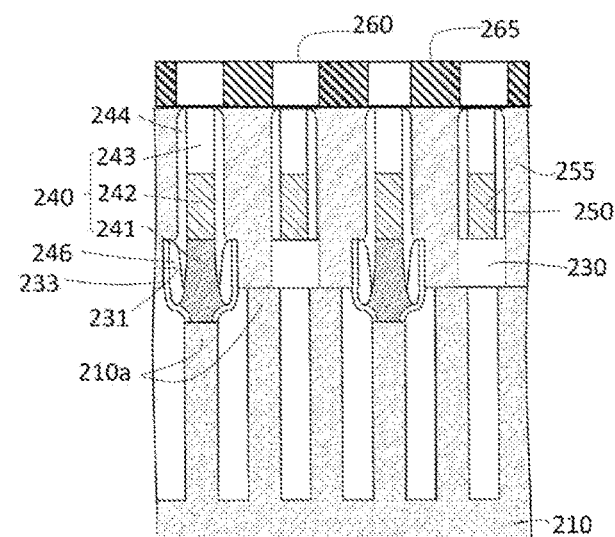

FIG. 2C illustrates a plane view of an intermediate stage of fabricating semiconductor device in accordance with some embodiments of the instant disclosure. FIG. 2D illustrates a cross section view of an intermediate stage of fabricating semiconductor device in accordance with some embodiments of the instant disclosure. In some embodiments, FIG. 2D is taken along a cut-line B-B indicated in FIG. 2C. In particular, FIG. 2C shows a plane view of several storage node contacts 255 that arranged in an array; while FIG. 2D shows each of the storage node contacts 255 is formed to enable vertical electrical connection between a corresponding active region (e.g., active regions 210a) and a corresponding landing pad 260. For illustrational simplicity and clarity, some detail/sub components of the exemplary device are not explicitly labeled in the instant FIGure. For example, FIG. 2C does not show the landing pads (e.g., landing pads 260)

The formation of the storage node contacts 255 may include patterning interlayer insulating layers (e.g., interlayer insulating layer 245 and 230) to form contact holes 250 therethrough, and filling the contact holes 250 with a conductive material that sever as the storage node contacts 255. The conductive material may comprise polysilicon, metal, metal silicide, metal nitride, or combinations thereof. In some embodiments, the storage node contacts 255 may be formed with an epitaxially disposed silicon layer. In some embodiments, the storage node contacts 255 may be formed by forming an epitaxial silicon layer and then depositing a metal layer. In some scenarios, the contact holes 250 may expose the BL spacers 244 and the lower spacers 233. The BL spacers 244 may separate the bit line contact 241 electrically and spatially from the storage node contact 255 in a horizontal direction.

In the illustrated embodiment, a landing pad insulating layer 260 is formed to cover the bit line stack features 240. Many landing pads 265 are formed penetrating the landing pad insulating layer 260.

In a plane view, the contact holes 250 and the storage node contact 255 may be arranged in arrays, each contact hole 250 is separated from neighboring contact holes 250. To enable higher degree of horizontal integration, distance between neighboring contact holes 250 may be reduced. To that end, double patterning technique may be utilized to pattern the contact holes 250 with reduced pitch separation that exceed the resolution limitation of currently adapted photolithography equipment.

Similar to contact holes 250, recess features for housing the landing pads 265 that penetrating the landing pad insulating layer 260 are close to each other. The fabrication of the recess features may also employ a double patterning technique. An exemplary fabrication of the recess features of an embodiment according to instant disclosure will be described in conjunction with FIGS. 26 to 33.

FIGS. 3A-18A, 3B-18B, and 11C-18C show exemplary fabrication processes of a semiconductor device 300 in accordance with some embodiments of the instant disclosure.

In particular, the FIGS. 3A-18A, 3B-18B, and 11C-18C show exemplary fabrication processes of patterning an insulation layer (e.g., insulation layer 245) to form contact holes (e.g., contact holes 250) for accommodating storage node contacts (e.g., storage node contacts 255) in accordance with some embodiments of the instant disclosure. The FIGS. 3B-18B are cross-sectional views respectively taken along a cut-line B-B indicated in FIG. 3A-18A. The FIGS. 11C-18C are cross-sectional views respectively taken along a cut-line C-C indicated in FIGS. 11A-18A. The illustrative embodiment of the semiconductor device 300 may be, for example, a Dynamic Random Access Memory (DRAM) device. For illustrational simplicity and clarity, some detail/sub-components of the exemplary device are not explicitly labeled in the instant figure. For example, structures under an insulation layer (e.g., insulation layer 245) such as substrate, BL contact holes, and BL stack features are not shown in FIGS. 3A-18A, 3B-18B, 11A-11C.

Figure 3B:
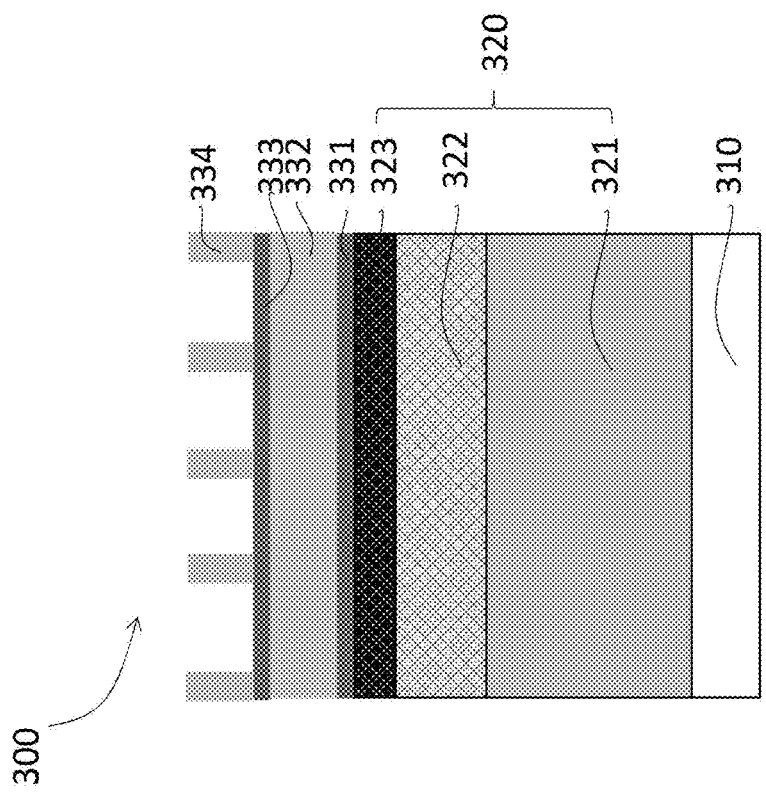
Figure 3A:
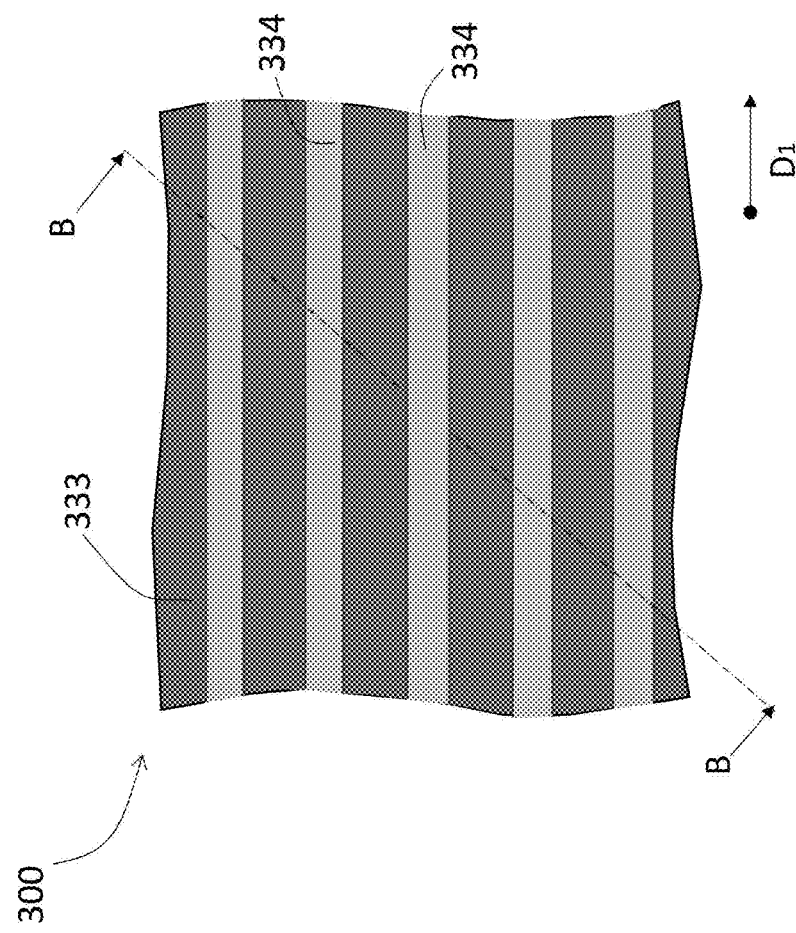

FIGS. 3A and 3B illustrate an intermediate stage of an exemplary fabricating process of a semiconductor structure in accordance with some embodiment. A device layer (target layer) 310 may serve as an interlayer dielectric layer (e.g., insulation layer 245) over a lower device layer (e.g., over the active devices in the active regions 112a/b), through which contact holes (e.g., contact holes 250) are formed to enable vertical connection. In some embodiments, the device layer 310 may serve as a molding layer formed over storage node contacts (e.g., storage node contacts 255) and configured to be patterned to have a plurality of high aspect ratio recess features. A lower electrode (e.g., lower electrode 120L) sequentially disposed in the recess feature may be shaped formed into a cylindrical structure having high aspect ratio.

A mask stack 320 is formed on the device layer 310. In some embodiments, the mask stack 320 may be formed via sequentially depositing a first mask layer 321, a second mask layer 322, and a spin on hard mask layer 323 over the device layer 310. The first mask layer 321 may comprise poly silicon. The second mask layer 322 may comprise silicon oxide. The spin on hard mask layer 323 may comprise carbon. In some embodiments, a thickness of the first mask layer 321 may be in a range from about 50 to 1000 nm. In some embodiments, a thickness of the second mask layer 322 may be in a range from about 100 to 500 nm. In some embodiments, a thickness of the spin on hard mask layer 323 may be in a range from about 50 to 500 nm.

A multi-layered film may be disposed on the mask stack 320. The multi-layered structure may be formed through disposing a first buffer layer 331, a first dummy layer 332, a first dummy mask layer 333 over the mask stack 320. In some embodiments of the instant disclosure, the first buffer layer 331 may include silicon oxide nitride, silicon carbon nitride, or combinations thereof. In some embodiments of the instant disclosure, the first dummy layer 332 may include carbon and be formed via performing a spin on coating process. In some embodiments of the instant disclosure, the first dummy mask layer 333 may include silicon oxide nitride, silicon carbon nitride, or combinations thereof. A thickness of the first dummy mask layer 333 may be in a range from about 10 to 500 nm.

In some embodiments, although not shown, an anti-reflective layer may be further formed on the first dummy mask layer 333. A photoresist layer may be disposed and patterned to form several linear photoresist patterns 334 on the first dummy mask layer 333 abreast each other extending along a first direction $D_1$.

Figure 4B:
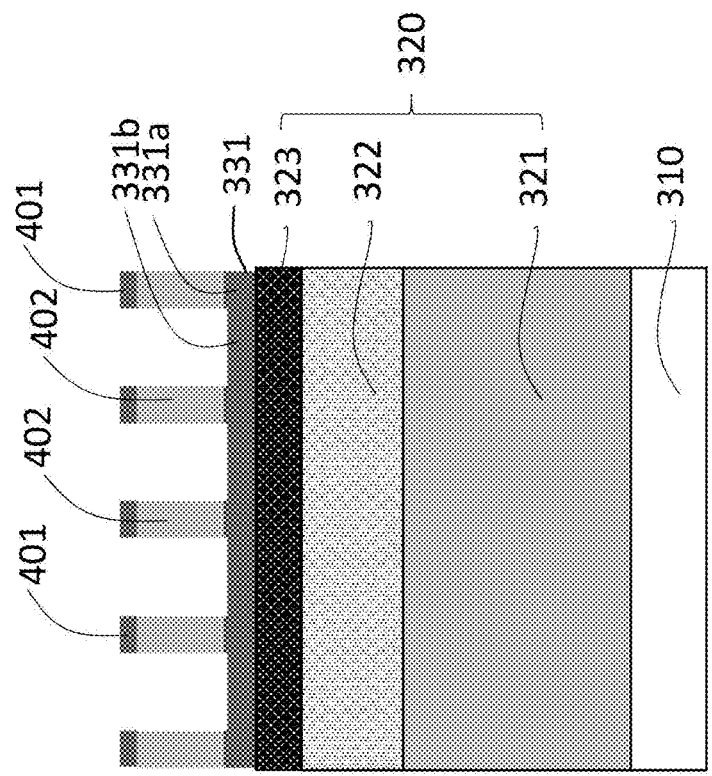
Figure 4A:
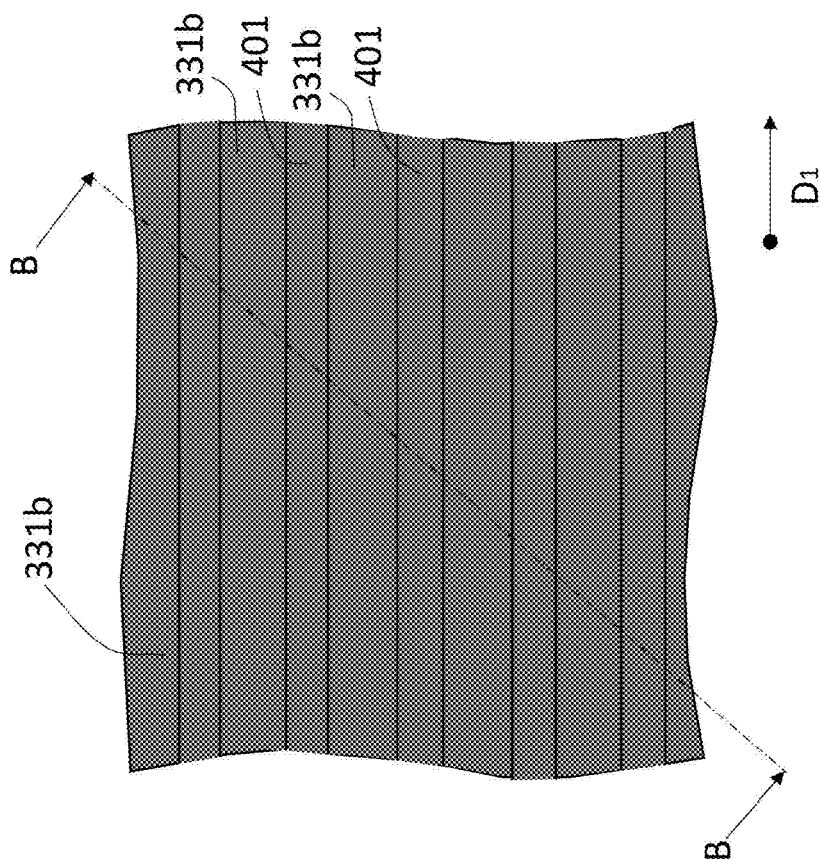

Referring to FIGS. 4A and 4B, the first dummy mask layer 333 may be patterned through the linear photoresist patterns 334 to form a plurality of first preliminary linear features 401 abreast each other extending along the first direction $D_1$.

Next, the exposed portions of first dummy layer 332 between the first preliminary linear features 401 maybe etched through the first preliminary linear features 401 to partially expose the first buffer layer 331. As such, a plurality of first linear dummy features 402 are formed on the first buffer layer 331. The first linear dummy features 402 are abreast each other and extending along the first direction $D_1$. In some scenarios, when the first dummy layer 332 is recessed, the exposed portions 331b of the first buffer layer 331 may be recessed concurrently such that the exposed portions 331b become lower than portions 331a of the first buffer layer 331 (under the first linear dummy features 402). The linear photoresist patterns 334 may be removed by, for example, an ashing process.

Figure 5B:
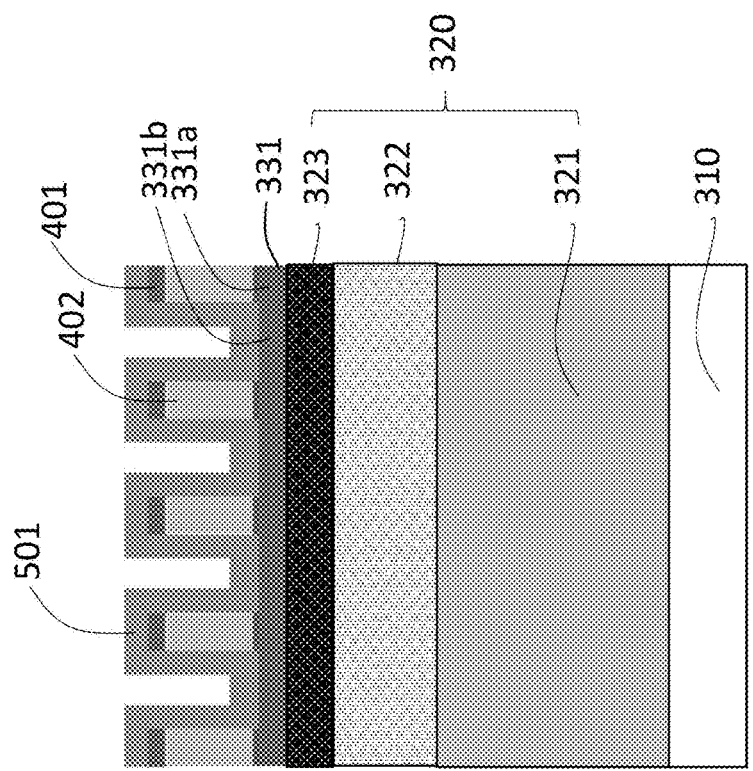
Figure 5A:
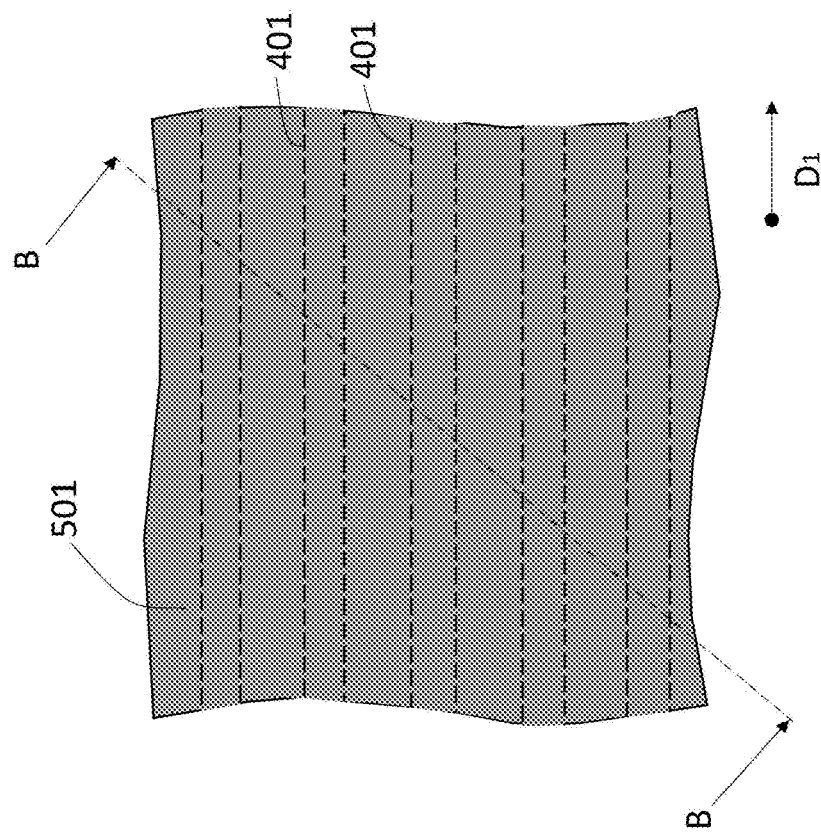

Referring to FIGS. 5A and 5B, a first liner layer (first spacer layer) 501 is formed and conformally lining over and between the first linear dummy features 402 (and over the first buffer layer 331). In some embodiments of the instant disclosure, the first liner layer 501 may be formed through performing an atomic layer deposition (ALD). In some embodiments, the first liner layer 501 may comprise silicon oxide and be referred as to a first oxide layer.

Figure 6B:
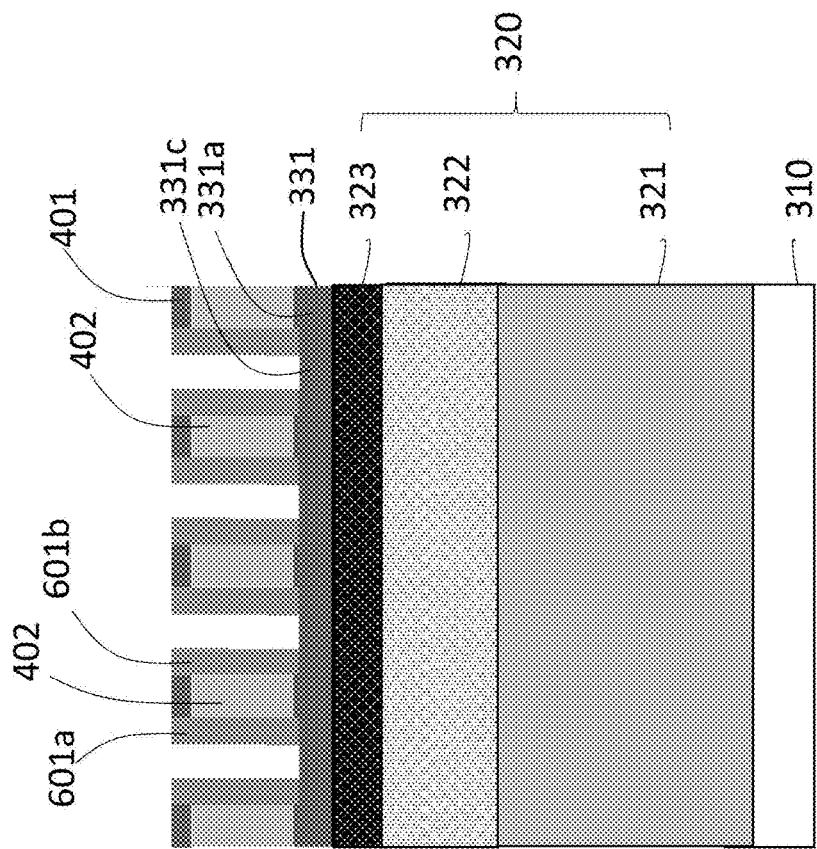
Figure 6A:
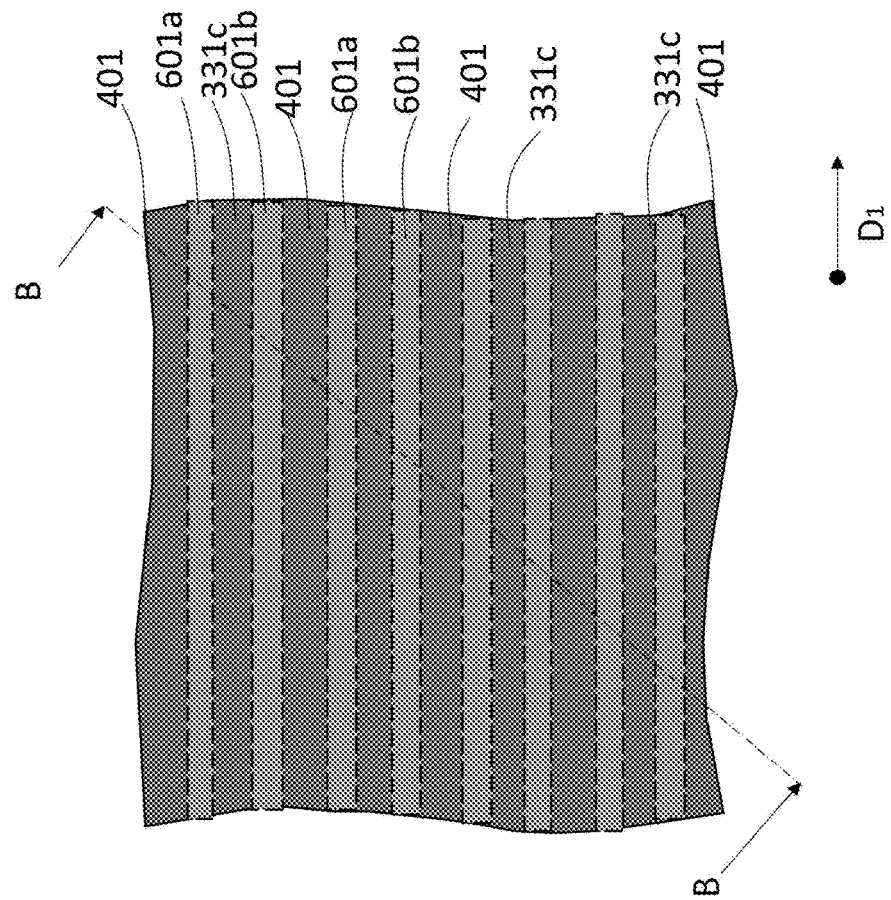

Referring to FIGS. 6A and 6B, an anisotropic etching operation is performed to remove horizontal portions of the first liner layer 501 on and between the first linear dummy features 402, such that a plurality pairs of first linear patterns 601a, 601b are formed. Each pair of the first linear patterns 601a, 601b is self-aligned with and covering both sidewalls of a corresponding first linear dummy feature 402.

Figure 7B:
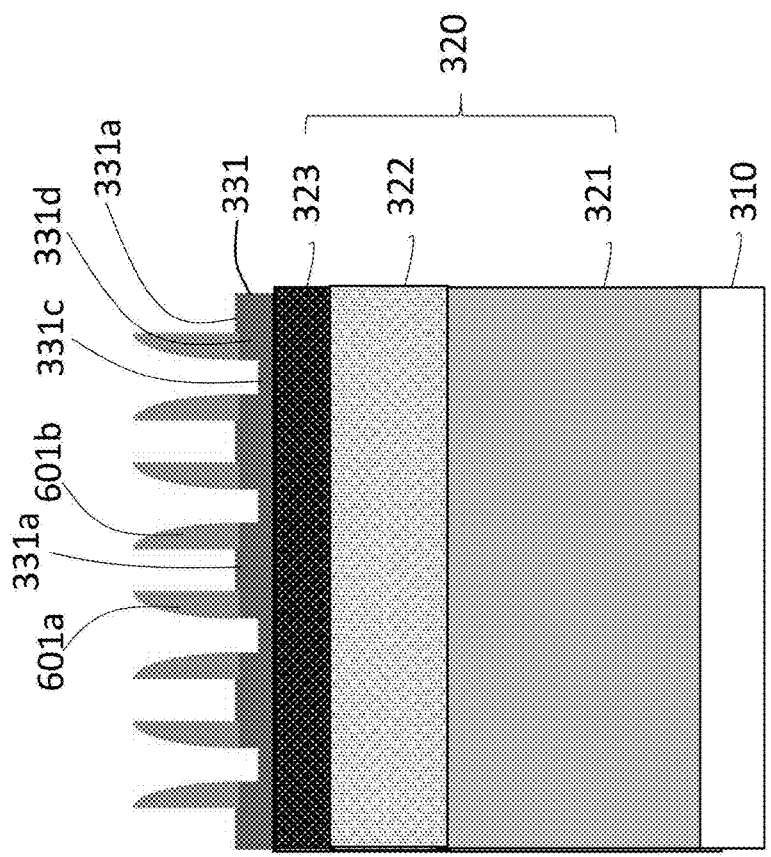
Figure 7A:
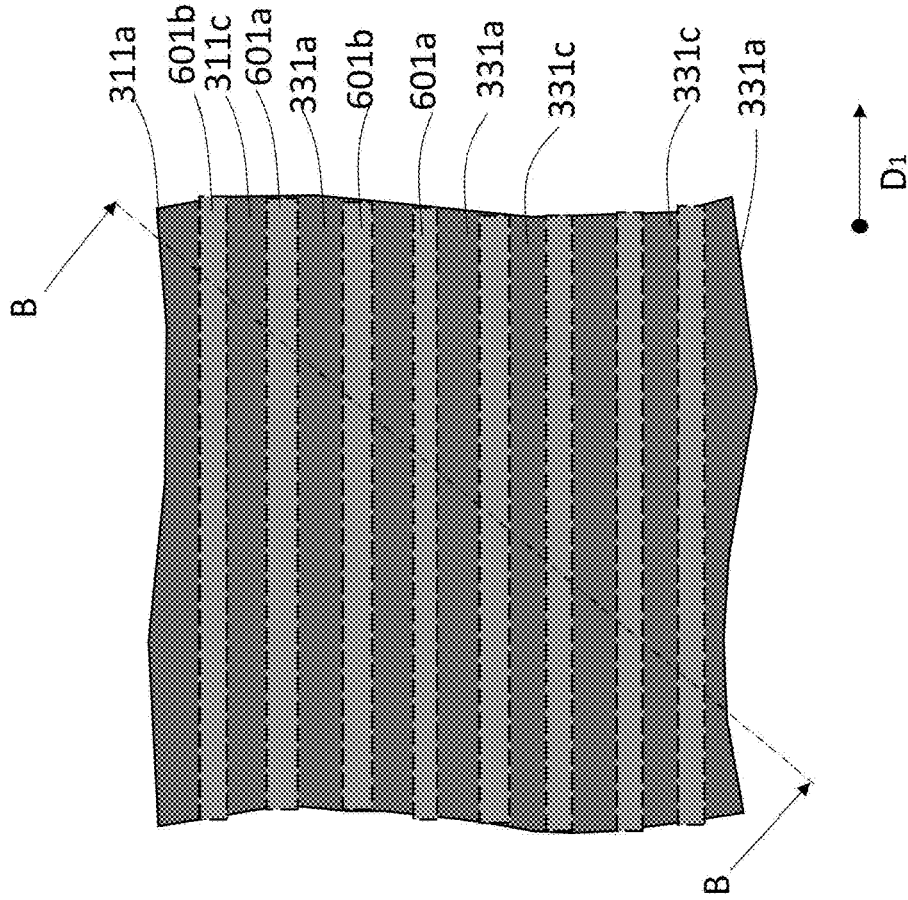

FIGS. 7A and 7B shows a dummy removal process, in which an anisotropic etch is performed to remove the first preliminary linear features 401 on top of the first dummy features 402. The edge portions of the first linear patterns 601a, 601b may be removed during the etch operation, thereby generating a wedge profile as shown. In some scenarios, the exposed portions 331c of the first buffer layer 331 are recessed concurrently, such that the exposed portions 331c become lower than the portions 331d (covered by the first linear patterns 601a, 601b). In some embodiments, the first preliminary linear features 401 are removed concurrently or by individual process to expose the first linear dummy features 402. Subsequently, the exposed first linear dummy features 402 may be removed by, for example, an ashing process. Portions 331a of the first buffer layer 331 (between the first linear features 601a/b) are thus exposed.

Figure 8B:
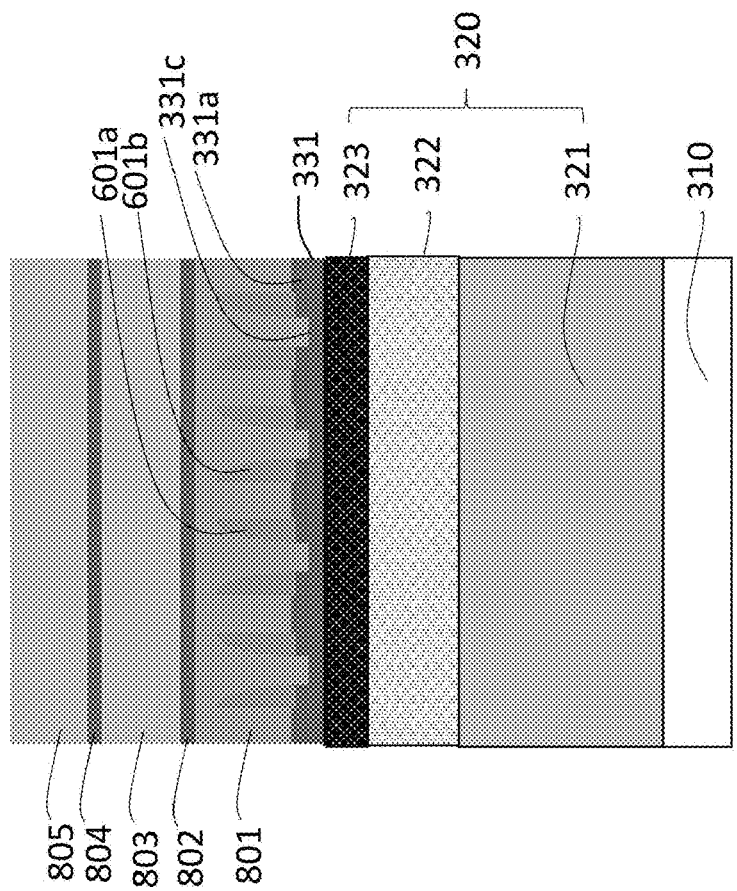
Figure 8A:
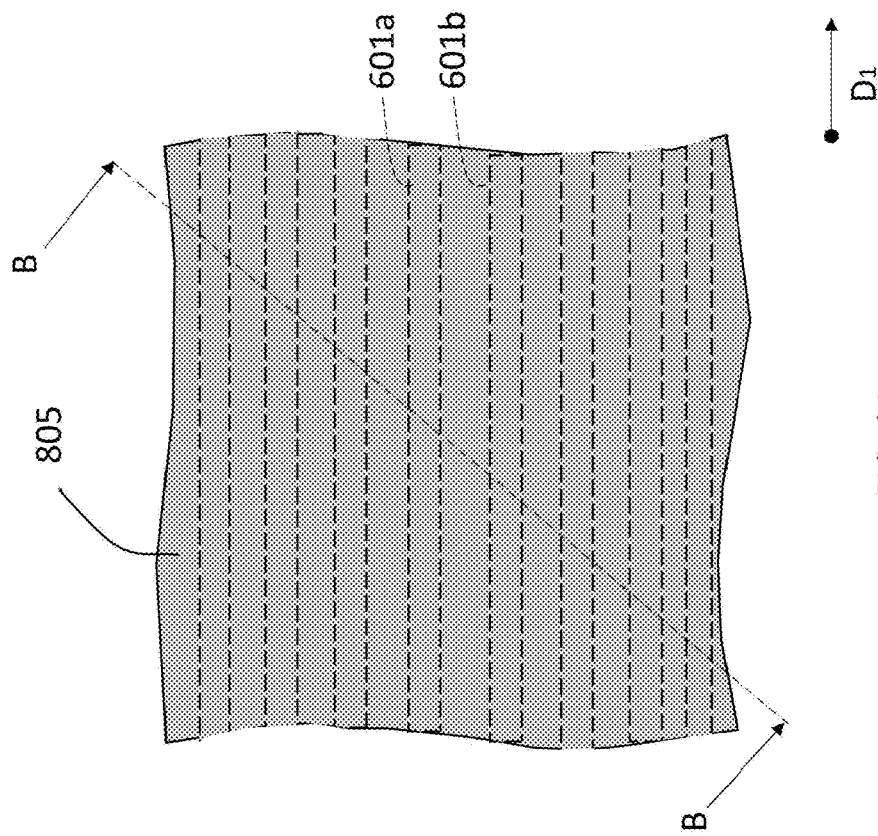

Referring to FIGS. 8A and 8B, a multi-layered structure is disposed to cover the exposed first linear patterns 601a, 601b. In some embodiments, a spin on hard mask layer 801 (which fills the gaps between the first linear patterns 601a, 601b), a second buffer layer 802, a second dummy layer 803, a second dummy mask layer 804, and a photoresist layer 805 are sequentially disposed on the first buffer layer 331. In some embodiments of the instant disclosure, spin on hard mask layer 801 may comprise carbon. The second buffer layer 802 may comprise silicon oxide nitride, silicon carbon nitride, or combinations thereof. In some embodiments of the instant disclosure, the second dummy layer 803 may include carbon and formed via performing a spin on coating process. In some embodiments of the instant disclosure, the second dummy mask layer 804 may comprise silicon oxide nitride, silicon carbon nitride, or combinations thereof.

Figure 9B:
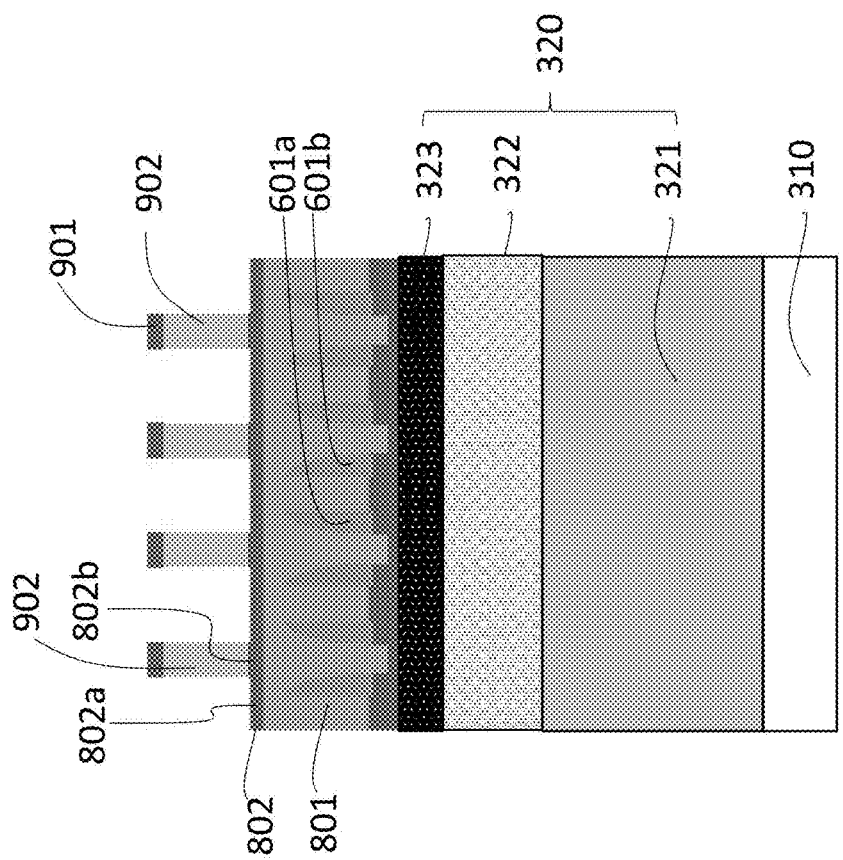
Figure 9A:
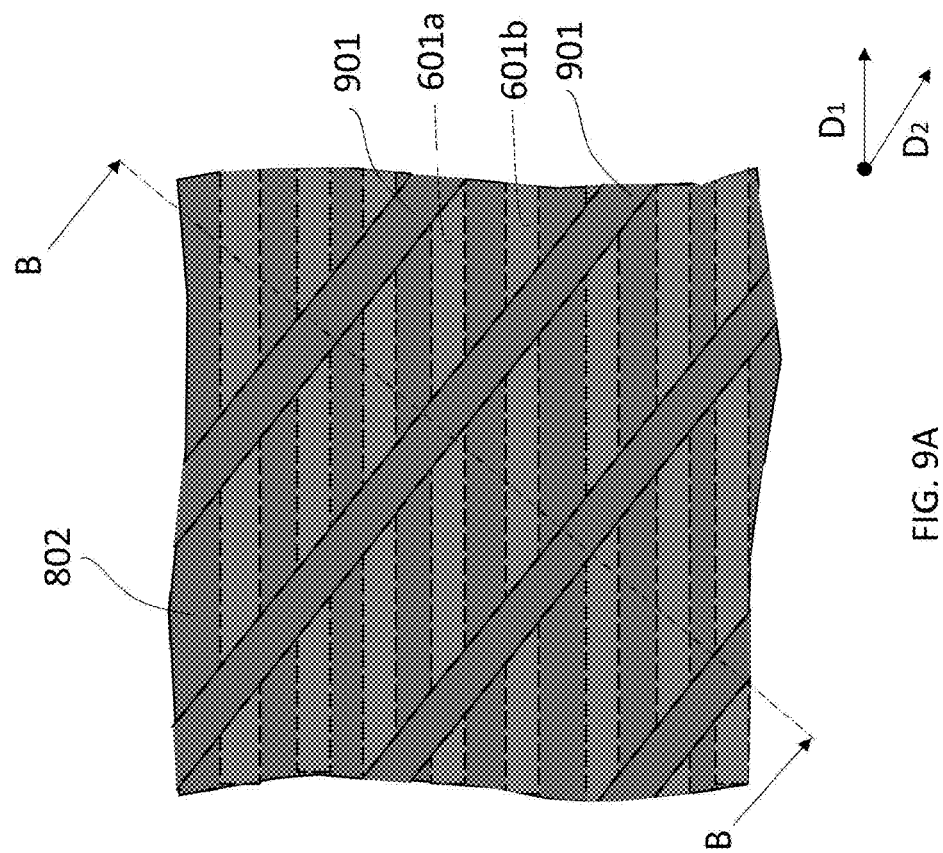

Referring to FIGS. 9A and 9B, similar to the process of patterning the first preliminary linear features 401 (shown in FIG. 4B), the second dummy mask layer 804 is patterned to form a plurality of second preliminary linear features 901 abreast each other extending in a second direction $D_2$ that projectively intercepts the first direction $D_1$.

The exposed portions of second dummy layer 803 are etched through the second preliminary linear features 901 to partially expose the second buffer layer 802. As such, a plurality of second linear dummy features 902 are formed on the second buffer layer 802 abreast each other and extending along the second direction $D_2$. In some scenarios, the exposed portions 802a of the second buffer layer 802 are etched concurrently such that the exposed portions 802a become lower than portions 802b of the second buffer layer 802 (under the second linear dummy features 902).

Referring to FIGS. 10A and 10B, a second liner layer (second spacer layer) 1001 is disposed and conformally lining over and between the second linear dummy features 902 (and over the second buffer layer 802). In some embodiments of the instant disclosure, the second liner layer 1001 may be formed via atomic layer deposition technique. In some embodiments, the second liner layer 1001 may comprise silicon oxide and be referred as to a second oxide layer.

Figure 11C:
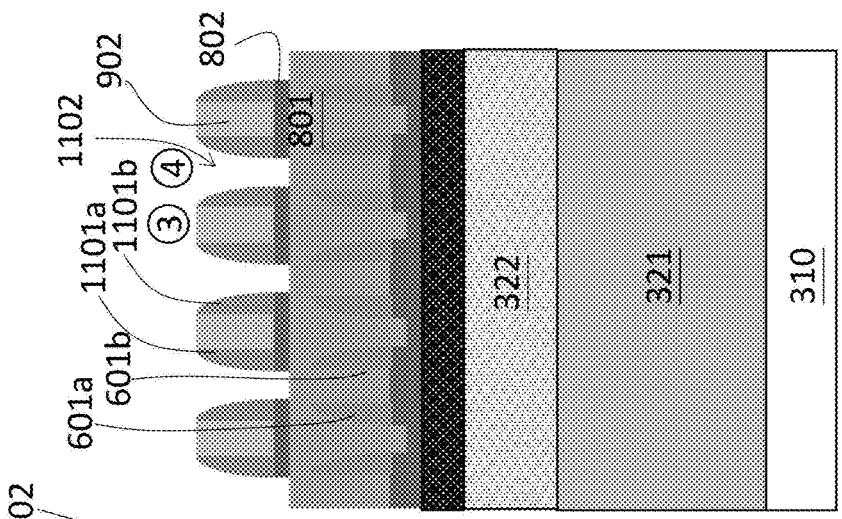
Figure 11B:
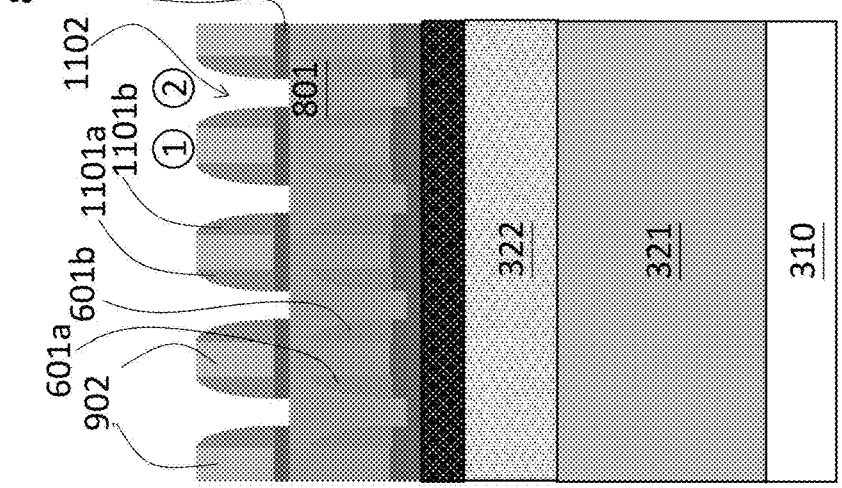
Figure 11A:
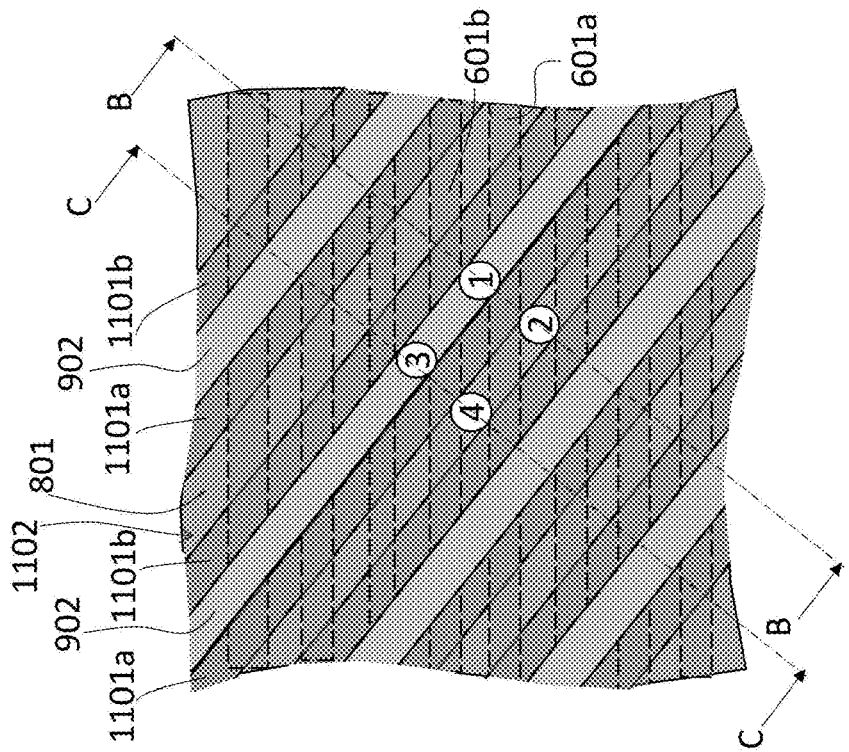

FIGS. 11A, 11B, and 11C show an intermediate stage of fabricating process of a semiconductor. The FIGS. 11B and 11C are cross-sectional views respectively taken along a cut-line B-B and a cut-line C-C indicated in FIG. 11A. in particular, the cut-line B-B passes through each second linear pattern 1001a (1001b) at a portion thereof that intercepts with a corresponding first linear pattern 601a (601b). A cut-line C-C passes through each second linear pattern 1001a (1001b) at a portion thereof that intercepts with a corresponding first linear pattern 601b (601a).

Referring to FIGS. 11A, 11B, and 11C, an anisotropic etching operation is performed to remove horizontal portions of the second liner layer 1001 on and between the second linear dummy features 902, such that a plurality pairs of second linear patterns 1101a, 1101b are formed. Each pair of the second linear patterns 1101a, 1101b is self-aligned with and covering both sidewalls of a corresponding second linear dummy features 902. In some embodiments, edge portions of the second linear patterns 1101a, 1101b may be removed via performing an anisotropic etching operation. In some embodiments, the second preliminary linear features 901 are removed concurrently or by individual process such that the second linear dummy features 902 are exposed. Two adjacent pairs of the second linear patterns 1101a, 1101b defines an inter-pairs gap 1102 there-between. The portions of the second buffer layer 802 exposed from the inter-pairs gaps 1102 are then recessed to expose portions of the spin on hard mask layer 801.

Referring to FIGS. 12A, 12B, and 12C, the exposed portions of the spin on hard mask layer 801 under the inter-pairs gaps 1102 between the second linear patterns 1101a, 1101b are recessed through the second linear patterns 1101a, 1101b and the first linear patterns 601a, 601b to expose portions of the first buffer layer 331. In addition, the second linear dummy features 902 are removed to expose portions of the second buffer layer 802 such that each pair of the second linear patterns 1101a, 1101b defines an intra-pair opening 1201.

Referring to FIGS. 13A, 13B, and 13C, the exposed portions of the second buffer layer 802 under the intra-pair openings 1201 are etched through the second linear patterns 1101a, 1101b to expose portions of the spin on hard mask layer 801 under the intra-pair openings 1201. In addition, the exposed portions of first buffer layer 331 under the inter-pairs gaps 1102 are removed through the first linear patterns 601a, 601b and the second linear patterns 1101a, 1101b to expose portions of the mask stack 320 (e.g., the spin on hard mask layer 323) under the inter-pairs gaps 1102.

Referring to FIGS. 14A, 14B, and 14C, the exposed portions of the spin on hard mask layer 801 (e.g., at the intra-pair openings 1201) are etched to expose portions of the first buffer layer 331 there-under through the second linear patterns 1101a, 1101b and the first linear patterns 601a, 601b. As such, the pattern defined by the second linear patterns 1101a, 1101b is transferred to the recessed spin on hard mask layer 801. In some scenarios, the exposed portions of the mask stack 320 exposed from the inter-pairs gaps 1102 may be etched concurrently. For instance, the spin on hard mask layer 323 of the mask stack 320 may be etched to partially expose the second mask layer 322.

Referring to FIGS. 15A, 15B, and 15C, the exposed portions of the first buffer layer 331 at the intra-pair openings 1201 are etched to expose portions of mask stack 320 exposed from intra-pair openings 1201 through the second linear patterns 1101a, 1101b and the first linear patterns 601a, 601b. In some scenarios, exposed portions of the mask stack 320 (e.g., exposed from the inter-pairs gaps 1102) may be further recessed concurrently. For instance, exposed portions of the second mask layer 322 exposed from the inter-pairs gaps 1102 may be recessed. In some scenarios, second linear patterns 1101a, 1101b and the remaining portions of the second buffer layer 802 may be removed such that remaining portions of the spin on hard mask layer 801 that overlaps with the second linear patterns 1101a, 1101b are exposed.

Figure 16C:
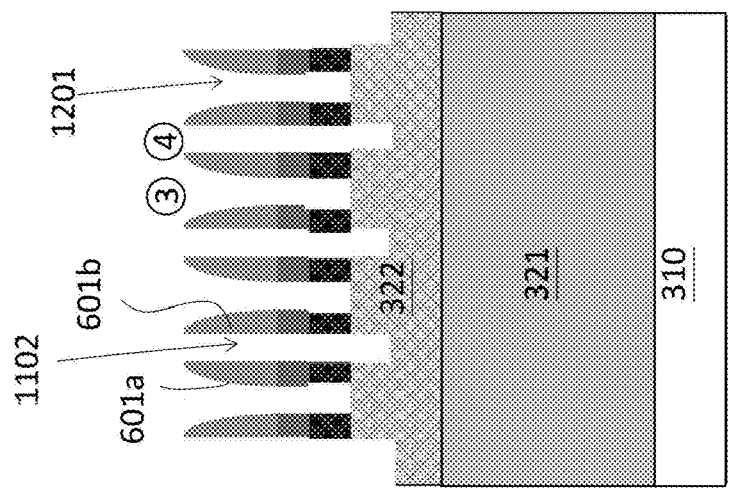
Figure 16B:
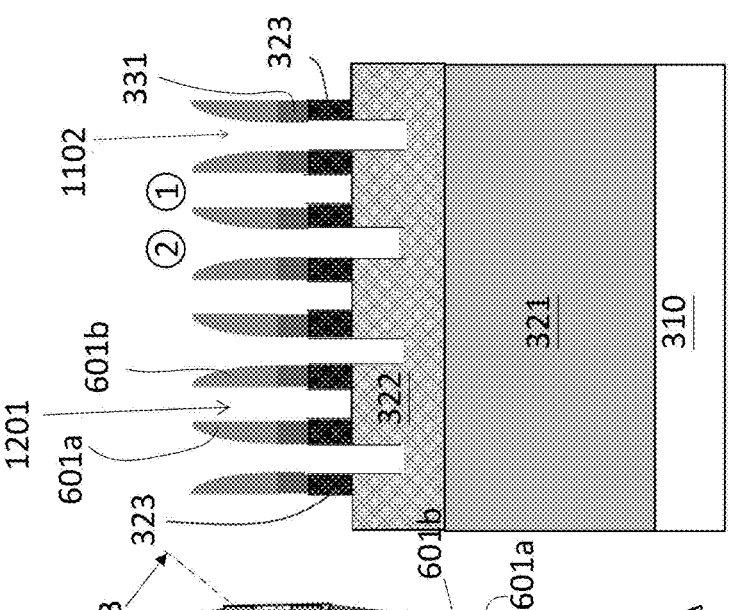
Figure 16A:
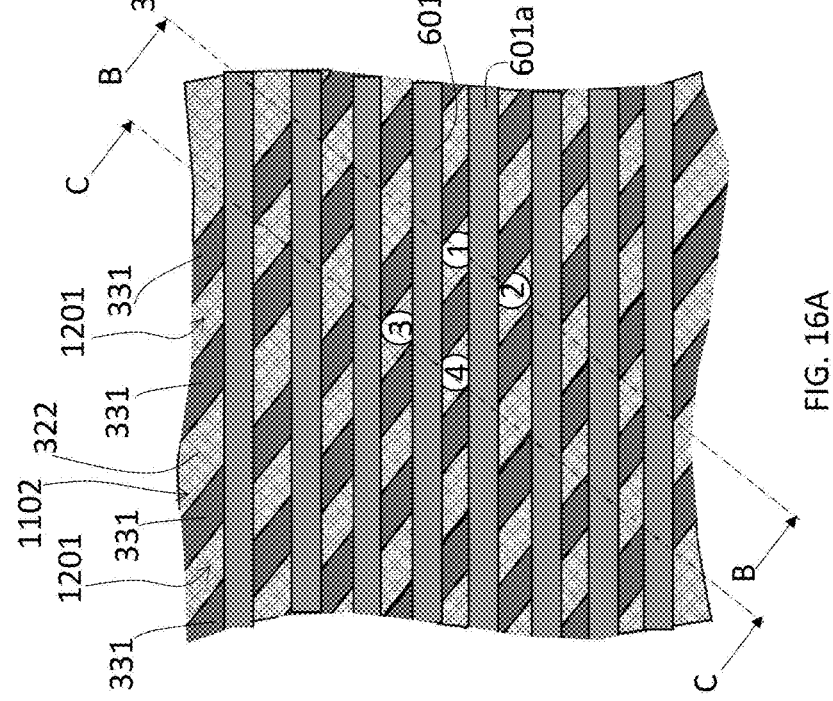

Referring to FIGS. 16A, 16B, and 16C, the exposed portions of the spin on hard mask layer 323 (e.g., exposed from the intra-pair openings 1201) are recessed to expose portions of the second mask layer 322 through the remained portions of the spin on hard mask layer 801 and the first linear patterns 601a, 601b. In the illustrative embodiment, portions of the second mask layer 322 are exposed from the intra-pair openings 1201 and the inter-pairs gaps 1102. Accordingly, a target pattern that is cooperatively defined by the projectively overlapping first and the second linear pattern features 601a/601b, 1101a/1101b may be transferred to the spin on hard mask layer 323.

Figure 17A:
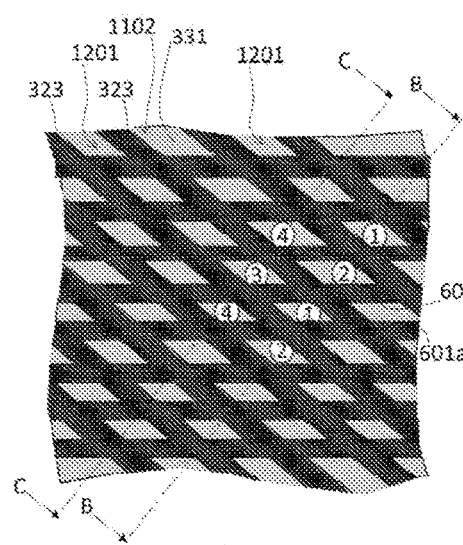
Figure 17B:
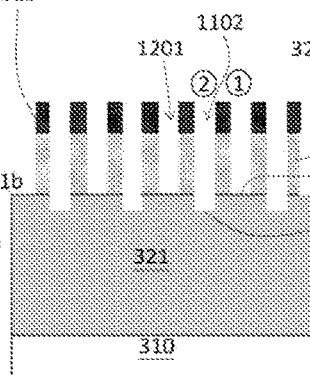
Figure 17C:
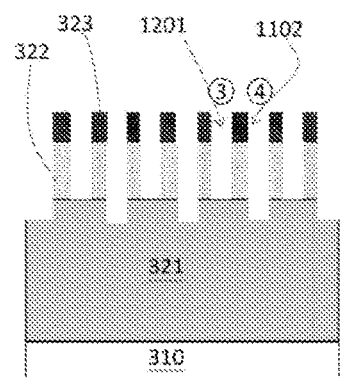

Referring to FIGS. 17A, 17B, and 17C, the exposed portions of the second mask layer 322 under the intra-pair openings 1201 and inter-pairs gaps 1102 are recessed to expose portions of the first mask layer 321 there-under. Accordingly, the target pattern defined by the projectively overlapping first and the second linear pattern features 601a, 601b, 1101a, 1101b is transferred to the second mask layer 322 and the first mask layer 321.

In some scenarios, the portions of the first mask layer 321 under the inter-pairs gaps 1102 are recessed during the process, thus a thickness variation in the first mask layer 321 may occur. For example, top surfaces $S_{inter}$ of the portions of the first mask layer 321 exposed from the inter-pairs gaps 1102 become lower than top surfaces $S_{intra}$ of the portions exposed from the intra-pair openings 1201.

The first mask layer 321 may be further recessed to form an etching mask for transferring the target pattern to the device layer 310. The device layer 310 may be etched through the etching mask (i.e., the recessed first mask layer 321) to generate contact holes at regions (e.g., regions ①, ②, ③ and ④) that overlaps with the inter-pairs gaps 1102 and intra-pair openings 1201. However, the thickness variation in the first mask layer 321 may result in adverse effect during contact hole formation process (e.g., causing uniformity imbalance in critical dimension) in the device layer 310.

FIGS. 18A-25A, 18B-25B, and 19C-25C show exemplary intermediate stages of a semiconductor device in accordance with some embodiments of the instant disclosure.

In particular, the FIGS. 18A-25A, 18B-25B, and 19C-25C show exemplary fabrication processes of patterning an inter-layer dielectric layer (e.g., insulation layer 245) to form contact holes (e.g., contact holes 250) for accommodating storage node contacts (e.g., storage node contacts 255) in accordance with some embodiments of the instant disclosure. Particularly, FIGS. 18B-25B are cross-sectional views respectively taken along a cut-line B-B indicated in FIGS. 18A-25A. The FIGS. 19C-25C are cross-sectional views respectively taken along a cut-line C-C indicated in FIGS. 19A-25A. For illustrational simplicity and clarity, some detail/sub components of the exemplary device are not explicitly labeled in the instant figure. For example, structures under the insulation layer (e.g., insulation layer 245) such as substrate, BL contact holes, and BL stack features are not shown in FIGS. 18A-25A, 18B-25B, and 19C-25C.

Figure 18B:
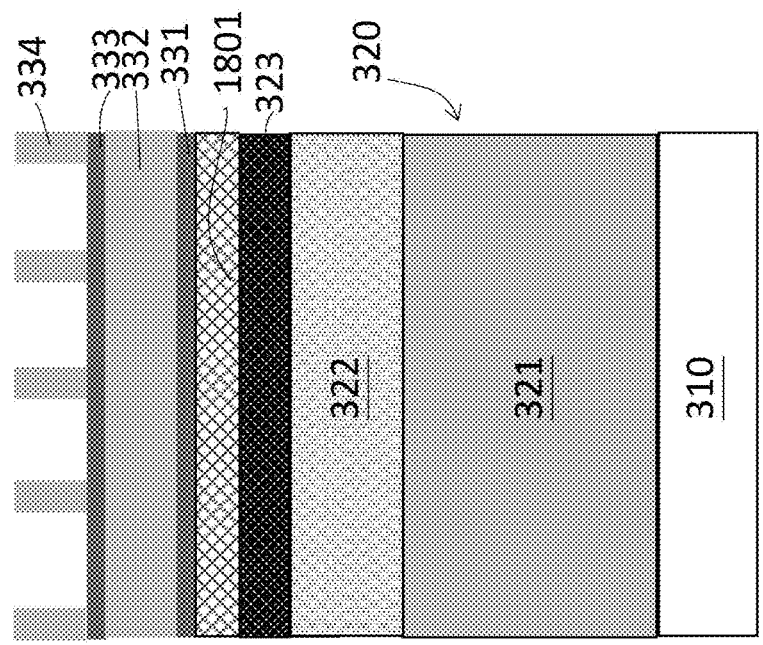
Figure 18A:
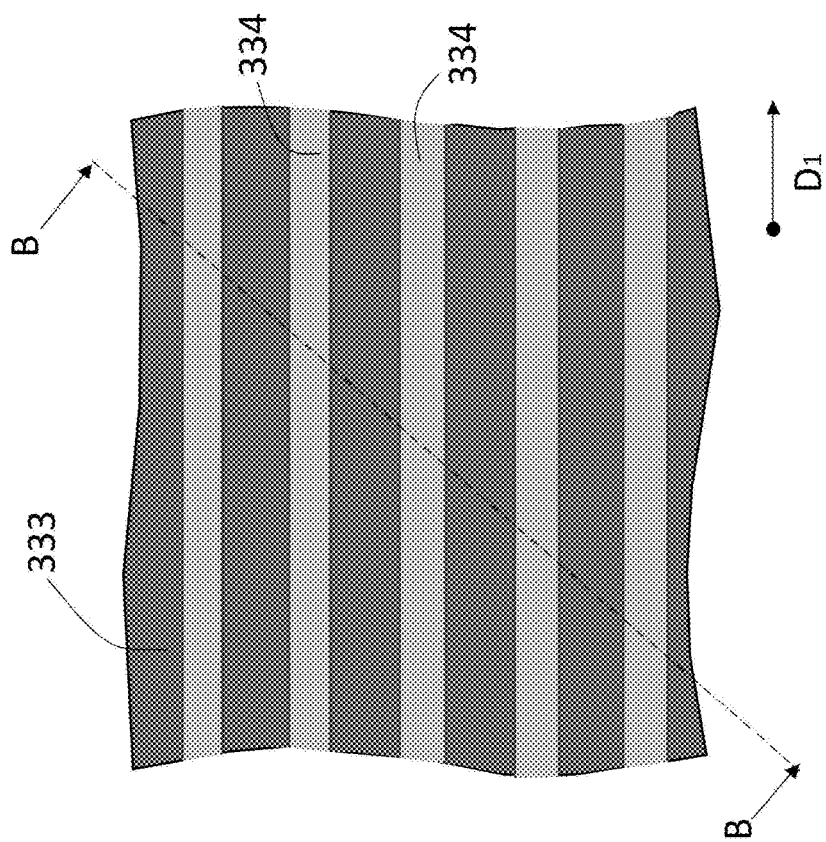

Referring to FIGS. 18A and 18B, a mid layer 1801 is formed on a mask stack (e.g., the mask stack 320). Subsequently, a first buffer layer 331, a first dummy layer 332, and a first dummy mask layer 333 are sequentially formed over the mid layer 1801.

The mid layer 1801 may also be referred as to a pre-mask etch stop layer. In some embodiments of the instant disclosure, the mid layer 1801 comprises material having etch selectivity to silicon nitride, silicon-nitride family, silicon-nitride series or a combination thereof. In some embodiments of the instant disclosure, the mid layer may selectively comprise $Si_3N_4$, SiCN, SiBN, poly silicon and poly-doped $Si_3N_4$. In some embodiments of the instant disclosure, the mid layer 1801 may be disposed with a thickness in a range from about 10 to 500 nm.

Referring to FIGS. 19A, 19B and 19C, first linear patterns 601a, 601b, a spin on hard mask layer 801, a second buffer layer 802, second linear dummy features 902 and second linear patterns 1101a, 1101b may be formed using processes discussed in accordance with the aforementioned embodiments (for example, processes described in association with FIGS. 3A-11A).

Subsequently, a mid layer opening process is performed to partially expose the mid layer 1801 and to recess the exposed portions of the mid layer 1801. Accordingly, a grid-type pattern over the mask stack 320 is formed (as shown in FIG. 19A). In particular, in order to partially expose the mid layer 1801, the second linear dummy features 902, the second buffer layer 902, the spin on hard mask layer 801, and the first buffer layer 331 are concurrently etched (through the first linear patterns 601a, 601b and the second linear patterns 1101a, 1101b). Details of the mid layer opening process may be described in FIGS. 20A-24A, 20B-24B, and 20C-24C.

In some embodiments, the first and the second linear patterns 601a, 601b, 1101a, 1101b may comprise silicon oxide. In such embodiments, the first and the second linear patterns 601a, 601b, 1101a, 1101b are referred to as first and the second oxide linear patterns, respectively. During mid layer opening process, the projectively intercepting first and second oxide linear patterns cooperatively form as an oxide grid pattern over the mid layer 1801.

Referring to FIGS. 20A, 20B and 20C, etching process described with the accompanying drawings such as FIGS. 12A, 12B, and 12C is performed. As a result, portions of the first buffer layer 331 under inter-pairs gaps 1102 and portions of the second buffer layer 802 under intra-pair openings 1201 are exposed.

Referring to FIGS. 21A, 21B and 21C, etching process described with the accompanying drawings such as FIGS. 13A, 13B, and 13C is performed. As a result, portions of the spin on hard mask layer 801 under intra-pair openings 1201 and portions of the mid layer 1801 under the inter-pairs gaps 1102 are exposed.

Referring to FIGS. 22A, 22B, and 22C, etching process described with the accompanying drawings such as FIGS. 14A, 14B, and 14C are performed. As a result, portions of the first buffer layer 331 under intra-pair openings 1201 are exposed. However, the mask stack 320 is protected by the mid layer 1801.

Figure 23C:
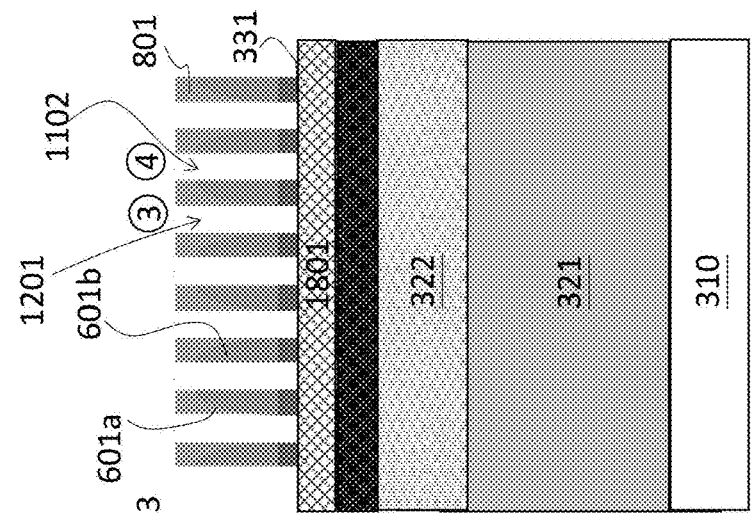
Figure 23B:
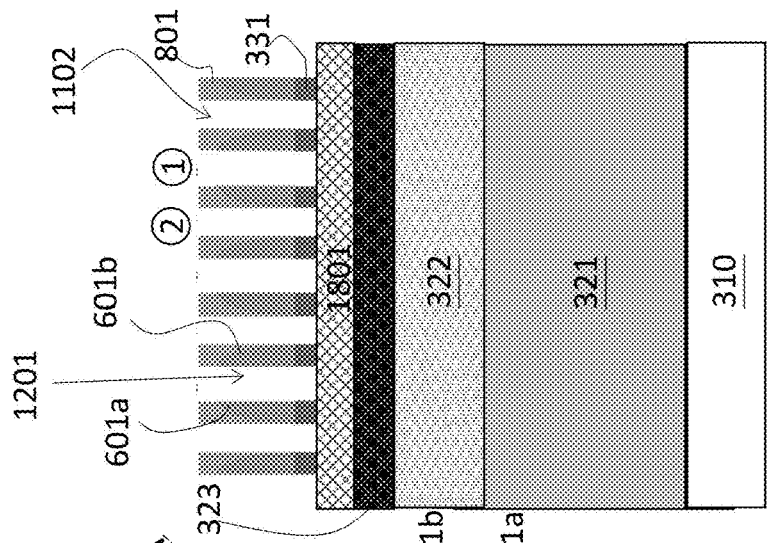
Figure 23A:
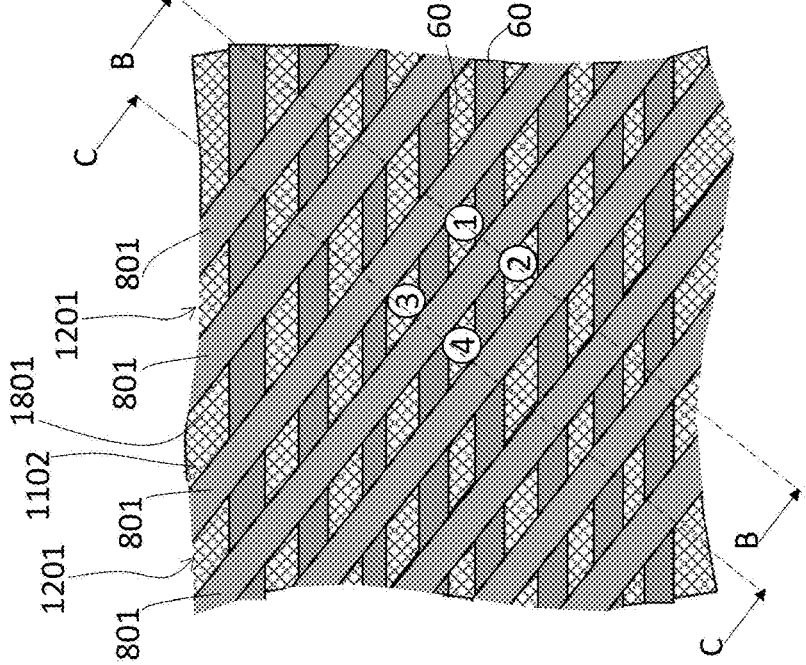
Figure 24C:
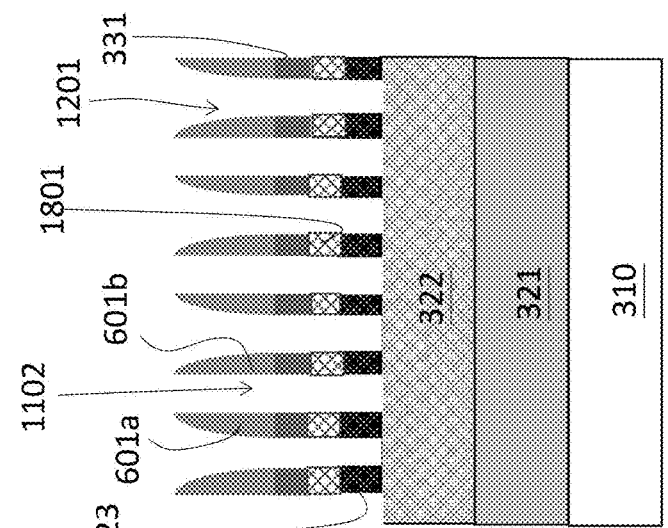
Figure 24B:
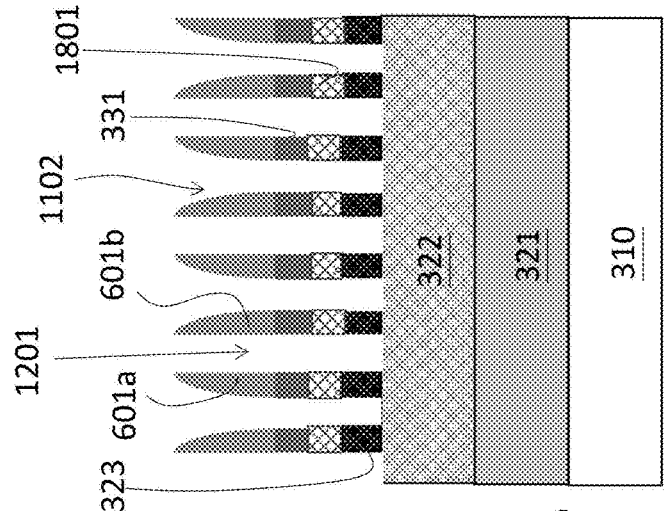
Figure 24A:
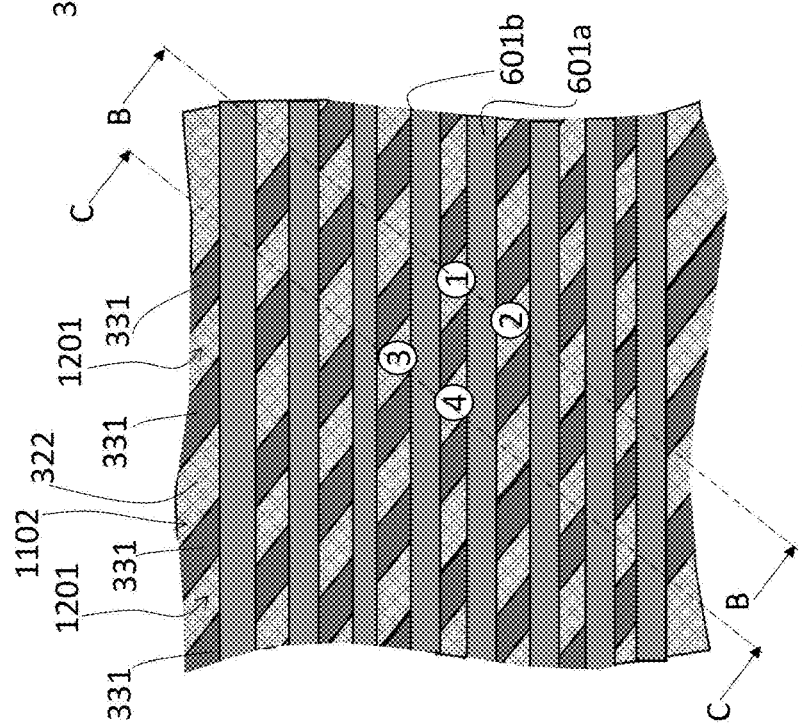

Referring to FIGS. 23A, 23B, and 23C, etching process described with the accompanying drawings such as FIGS. 15A, 15B, and 15C are performed. Portions of the first buffer layer 331 under the intra-pair openings 1201 are recessed. As a result, portions of the mid layer 1801 under intra-pair openings 1201 are exposed. However, the mask stack 320 is protected by the mid layer 1801.

FIG The exposed portions of the mid layer 1801 under the intra-pair openings 1201 and the inter-pairs gaps 1102 are then recessed to form a grid-type pattern over the mask stack 320. The grid-type pattern projectively overlapping the first and the second linear patterns 601a, 601b, 1101a, 1101b. In the embodiment illustrated in FIGS. 24A, 24B, and 24C, the spin on hard mask layer 323 is recessed concurrently or by individual processes to partially expose the second mask layer 322.

It is worth mentioning that during the mid layer opening process (e.g., processes illustrated in FIGS. 20A-24A, 20B-24B, and 20C-24C), top portion of the mask stack 320 (e.g., the spin on hard mask layer 323) is protected by the mid layer 320. Therefore, thicknesses of the mask stack 320 (in particular, the spin on hard mask layer 323) may be maintained substantially uniform. As a result, when the spin on hard mask layer 323 is partially etched to expose the second mask layer 322, the thicknesses of the second mask layer 322 may be maintained substantially uniform.

Figure 25A:
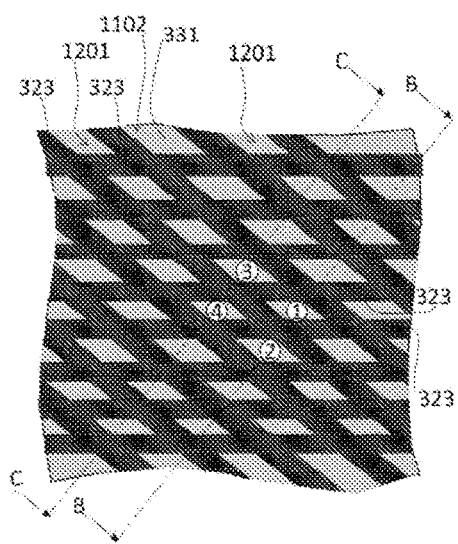
Figure 25B:
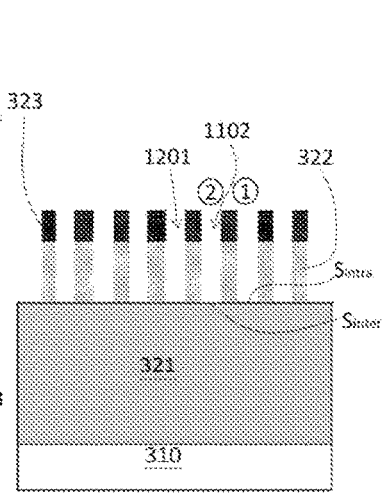
Figure 25C:
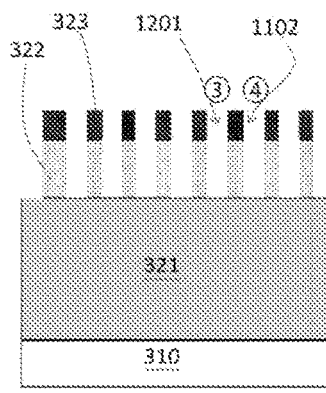

Referring to FIGS. 25A, 25B, and 25C, etching process may be similar to that described with respect to FIGS. 17A, 17B, and 17C are performed. The exposed portions of the second mask layer 322 under the intra-pair openings 1201 and the inter-pairs gaps 1102 are recessed to expose portions of the first mask layer 321 under the intra-pair opening 1201 and the inter-pairs gaps 1102. In some embodiments, remaining portions of the first linear patterns 601a, 601b, the first buffer layer 331, and the mid layer 1801 may be removed concurrently or by individual processes.

Top surfaces $S_{inter}$ of the portions of the first mask layer 321 under the inter-pairs gaps 1102 are substantially at a same level with top surfaces $S_{intra}$ of the portions under the intra-pair openings 1201. Due to the thickness uniformity of the first mask layer 321, the quality of the subsequentially generated contact holes in the device layer 310 is improved.

Accordingly, some embodiments of instant disclosure provides a method of fabrication a semiconductor device comprises forming a mask stack (e.g., mask stack 320) over a device layer (e.g., device layer 310); forming a mid layer (e.g., mid layer 1801) over the mask stack; forming a first buffer layer (e.g., device layer 331) on the mid layer; forming a plurality of lower linear patterns (e.g., first linear patterns 601a, 601b or first linear dummy features 402) on the first buffer layer abreast each other extending in a first direction different from the first direction; sequentially deposing a spin on hard mask layer (e.g., spin on hard mask layer 801) filling between the lower linear patterns, and a second buffer layer (e.g., second buffer layer 802) on the spin on hard mask layer; forming a plurality of upper linear patterns (e.g., upper linear patterns 1101a, 1101b or second linear dummy features 902) on the second buffer layer abreast each other extending along a second direction that projectively intercepts the first direction; performing a mid layer opening process by concurrently etching the second buffer layer, the spin on hard mask layer, and the first buffer layer through the lower linear patterns and the upper linear patterns to partially expose the mid layer; and etching the exposed portions of the mid layer to form a grid-type pattern over the mask stack.

FIGS. 26-33 show exemplary fabrication processes of a semiconductor device in accordance with some embodiments of the instant disclosure. In particular, the FIGS. 26-33 show exemplary fabrication processes of patterning an interlayer dielectric layer (e.g., landing pad insulating layer 260) to form recess features for accommodating landing pads (e.g., landing pads 265) in accordance with some embodiments of the instant disclosure. The illustrative embodiment of the semiconductor device may be, for example, a Dynamic Random Access Memory (DRAM) device. In some embodiments, the fabrication processes illustrated in FIGS. 26-33 may be performed In-Situ. For illustrational simplicity and clarity, some detail/sub-components of the exemplary device are not explicitly labeled in the instant figure. For example, structures under an landing pad insulating layer such as substrate, BL stack features, BL contacts are not shown in FIGS. 26-33.

Figure 26:
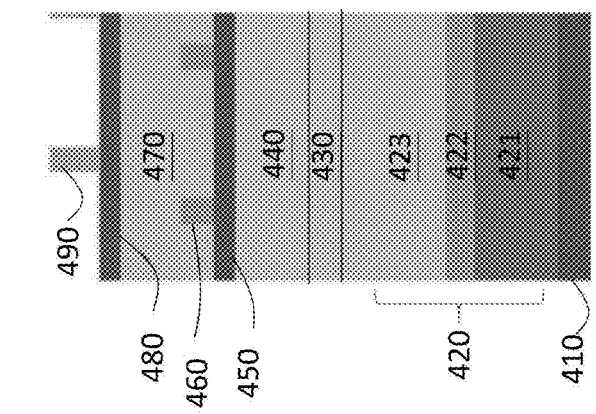

Referring to FIG. 26, a mask layer 420 is disposed over a device layer 410. In some embodiments, the device layer 410 serves as an interlayer dielectric layer (e.g., landing pad insulating layer 260) in a semiconductor device (e.g., DRAM), in which one or more landing pads may be formed there-through. The mask layer 420 includes one or more than one sublayers. For example, in the illustrated embodiment, mask layer 420 is a multi-layered mask, the formation thereof comprises sequentially disposing an amorphous carbon layer (ACL) 421 on the device layer 410, a silicon oxide layer 422 on the amorphous carbon layer 421, and a spin-on hard mask layer 423 on the silicon oxide layer 422. In some embodiments, a thickness of the ACL 421 is about 1000 Å. The silicon oxide layer 422 may be formed by performing an atomic layer deposition and has a thickness a range from about 300 to 400 Å. In some embodiments, silicon oxide layer 422 has a thickness about 360 Å. In some embodiments, the spin-on hard (SOH) mask layer 423 is formed via performing a spin-on process to a thickness ranged from about 1200 to 1300 Å. For example, the SOH mask layer 423 has a thickness about 1230 Å.

Next, a dummy stack is formed over the multi-layered mask 420. The dummy stack comprises multiple dummy layers. For example, in the illustrated embodiment, a first dummy layer 430 and a second dummy layer 440 are sequentially disposed over the multi-layered mask 420. The second dummy layer may have a different etching selectivity with respect to the first dummy layer. For example, first dummy layer 430 comprises a tetraethoxysilane (TEOS) layer; while the second dummy layer 440 (an upper portion of the dummy stack) comprises SOH material such as carbon containing materials. A thickness ratio between the first and the second dummy layer is ranged from about 0.3 to 0.5. For example, in the illustrated embodiment, the thickness ratio between the first and the second dummy layer 430, 440 is about 0.44. The first dummy layer 430 has a thickness from about 300 to 500 Å. For example, the first dummy layer 430 has a thickness about 400 Å.

Over the dummy stack, a first buffer layer 450 and a first pattern structure 460 defining a first pattern group are sequentially disposed. The first buffer layer has a thickness ranged from about 200 to 300 Å. The first buffer layer may comprise silicon oxide nitride or silicon nitride. For example, the first buffer layer 450 comprises silicon oxide nitride and a thickness of about 260 Å. In some embodiments, the first pattern structure 460 is formed via sequentially disposing a pattern layer (not shown) on the first buffer layer 450 and patterning the pattern layer to form the first pattern structure 460 over the second dummy layer 440. In some embodiments, the pattern layer is deposited via performing an atomic layer deposition using material comprising silicon oxide to a thickness about 400 Å.

Later, the first pattern structure 450 is covered by disposing a third dummy layer 470 there-over. In some embodiments, the third dummy layer 470 has an etching resistance substantially equal to that of the second dummy layer 440. For example, the third dummy layer 470 may include SOH thereby possesses an identical etching resistance as the second dummy layer 440. Next, a second buffer layer 480 and a mask 490 defining a second pattern group are sequentially disposed on the third dummy layer 470. The second buffer layer has a thickness from about 200 to 300 Å. The second buffer layer comprises silicon oxide nitride or silicon nitride. For example, the second buffer layer 480 comprises silicon oxide nitride and a thickness of about 260 Å.

Figure 27:
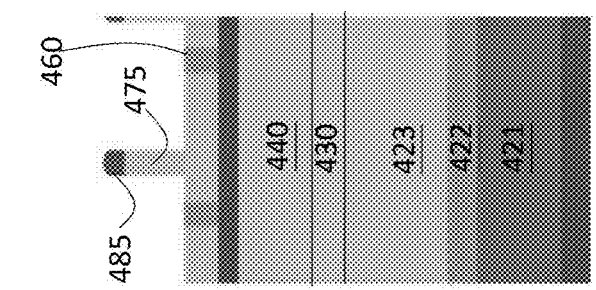

Referring to FIG. 27, the second buffer layer 480 (shown in FIG. 26) is patterned via the mask 490 to form a second pattern structure 485 defining the second pattern group over the first pattern structure 460. In the illustrated embodiment, the third dummy layer 470 (shown in FIG. 26) is recessed through the second pattern structure 485 such that the second pattern group is transferred to a recessed third dummy layer 475. In the illustrative embodiments, the first pattern structure 460 is exposed.

Figure 28:
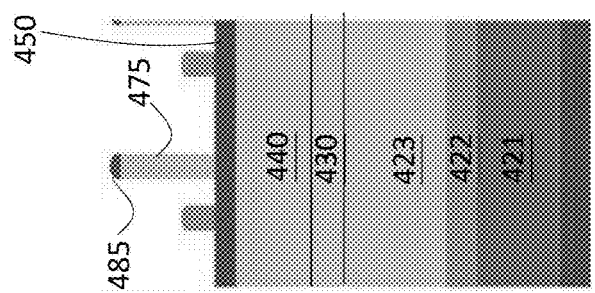

Referring to FIG. 28, portions of the first buffer layer 450 are exposed via further recessing the recessed third dummy layer 475. Meanwhile, the second pattern structure 485 is concurrently etched thus become thinner.

Figure 29:
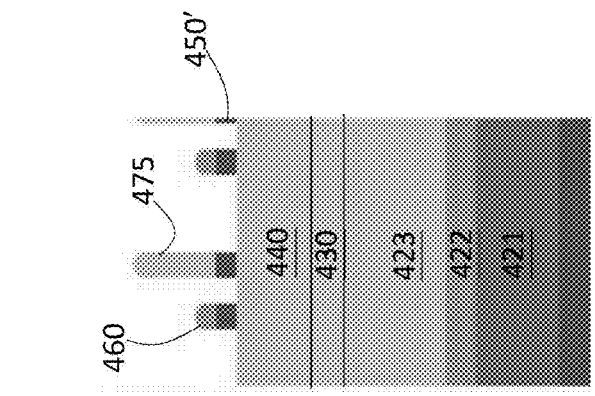
FIGS. 26-33 illustrate cross section views of intermediate stages of fabricating semiconductor device in accordance with some embodiments of the instant disclosure.

Referring to FIG. 29, the first buffer layer 450 is recessed via the first pattern structure 460 and the recessed third dummy layer 475 (which defines the second pattern group) to partially expose the second dummy layer 440. As such, the first and the second pattern groups are transferred to a recessed first buffer layer 450'. Moreover, the second pattern structure 485 is removed to expose the recessed third dummy layer 475. In some embodiments, the removal of the second pattern structure 485 and the recessing applied on the first buffer layer 450 may be performed concurrently (e.g., the second pattern structure 485 and the first buffer layer 450 are etched in same etching process(es)).

Figure 31:
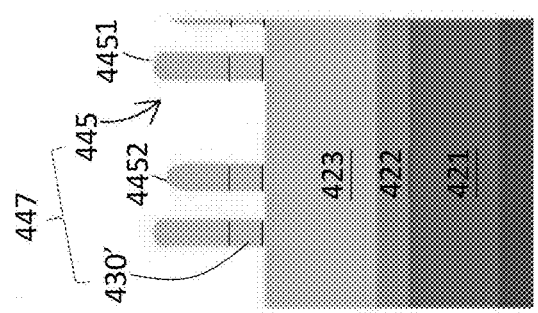
Figure 30:
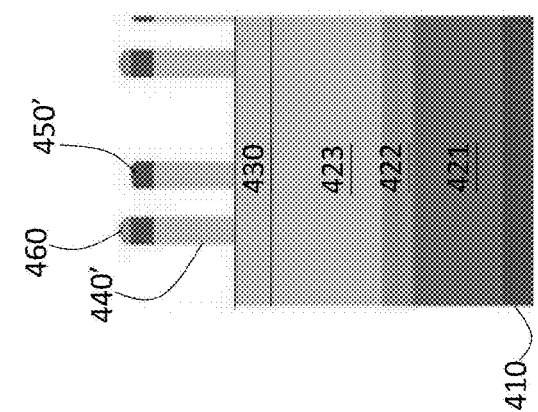

FIGS. 30 and 31 show the processes of the dummy stack (e.g., the first and the second dummy layer 430, 440) being recessed through the recessed first buffer layer 450', thereby forming a target pattern structure 447 defining a target pattern that projectively overlapping with the first and the second pattern group. In particular, the upper portion (e.g., second dummy layer 440) and the lower portion (e.g., first dummy layer 430) of the dummy stack is patterned to define the target pattern; while the multi-layered mask 420 is partially exposed. Since the recessed first buffer layer 450' defines the first and the second pattern group (transferred from the first and second pattern structure 460, 485), the recessed first buffer layer 450' as a mask during the recessing process may act as the first and second pattern structure 460, 485.

Referring to FIG. 30, the exposed portions of the second dummy layer 440 (shown in FIG. 29) is recessed till the portions of the first dummy layer 430 there-under are exposed while the first dummy layer 430 is partially exposed. In the illustrated embodiment, since the third dummy layer 470 (shown in FIG. 26) has an etching resistance substantially equal to that of the second dummy layer 440, the recessed third dummy layer 475 (shown in FIG. 29) is removed concurrently such that portions of the first buffer layer (e.g., the recessed first buffer layer 450') there-under are exposed.

Referring to FIG. 31, the remaining portions of the first buffer layer (e.g., the recessed first buffer layer 450') on the recessed second dummy layer 440' is etched and removed. Moreover, the first pattern structure 460 that partially covers the remain portions of first buffer layer (e.g., the recessed first buffer layer 450') is etched and removed. An etching process (e.g., an anisotropic etching process) is performed through the recessed second dummy layer 440' to recess the exposed portions of the first dummy layer 430 such that the target pattern is transferred to the recessed first dummy layer 430', thereby forming a target pattern structure 447 (including the recessed first dummy layer 430' and a remaining second dummy layer 445). In some embodiments, the removal of and recessed first buffer layer 450' and the first pattern structure 460 may be carried out in the anisotropic etching process. In the illustrated embodiment, portions (e.g., 4451) of the remaining second dummy layer 445 of the target pattern structure 447 (upper portion of the target pattern structure 447) corresponding to the first pattern group are higher than portions (e.g., 4452) of the remaining second dummy layer 445 corresponding to the second pattern group.

Figure 32:
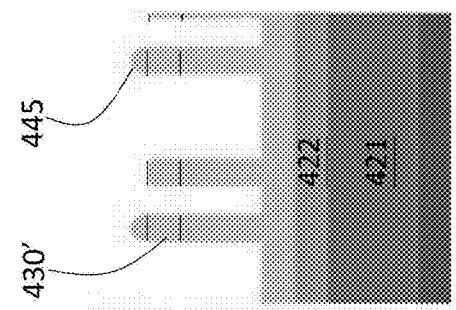

Referring to FIG. 32, a pattern transferring process is performed by recessing the multi-layered mask 420 through the target pattern structure 447 to transfer the target pattern to the multi-layered mask 420. In some embodiments, the pattern transferring process comprises recessing the spin-on hard mask layer 423 of the multi-layered mask 420 through the recessed first dummy layer 430' to transfer the target pattern to the spin-on hard mask layer 423.

Figure 33:
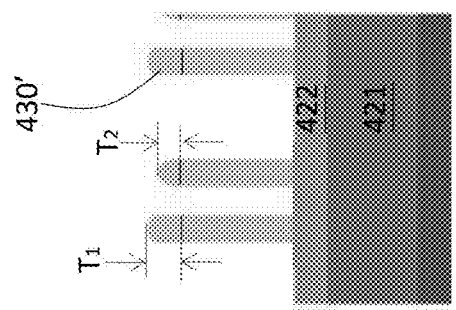

Referring to FIG. 33, the spin-on hard mask layer 423 is further recessed to expose the silicon oxide layer 422 there-under. In the illustrated embodiment, the remaining second dummy layer 445 (shown in FIG. 32) on the recessed first dummy layer 430' is removed concurrently. Meanwhile, portions of the recessed first dummy layer 430' that was not covered by the remaining second dummy layer 445 is etched concurrently. As such, the recessed first dummy layer 430' has a first thickness $T_1$ and a second thickness $T_2$, where $T_1 > T_2$.

In later fabrication, the device layer 410 is patterned utilizing the patterned multi-layered mask 420. As such, the target pattern (projectively overlaps with the first and the second pattern group) is transferred to the device layer 410, thereby recess features for housing subsequentially fabricated landing pads are formed penetrating the device layer 410.

In some embodiments, the forming the first and the second pattern structures comprising respectively arranging the first and the second pattern groups in form of segmented pattern components, wherein the first and the second pattern structures do not projectively overlap. For example, in a plane view, the landing pads may be arranged in a honeycomb-like structure. In such embodiments, before the disposing of the landing pads, a device layer (e.g., device layer 410) may by patterned utilizing the embodiment previously described in conjunction with FIGS. 26-33 to form recess features in a honeycomb-like arrangement for housing the landing pads. By ways of example, the first pattern structure (e.g., first pattern structure 460) projectively overlapping the target pattern includes a plurality of island type dots that are substantially equidistantly arranged in a plane view; while the second pattern structure (e.g., second pattern structure 485) includes a plurality of island type dots offsetting (e.g., not projectively overlapping with) the first pattern group. In such example, the target pattern includes honeycomb-like arranged island type dots having a shorter pitch than that of the first and the second pattern structure.

In some embodiments, the forming the first and the second pattern structures comprising respectively arranging the first and the second pattern groups in form of linearly continuous pattern components, wherein the first and the second pattern structures partially projectively overlap. For example, in a plane view, the landing pads may be arranged in an array. For such example, the first pattern structure (e.g., first pattern structure 460) includes a plurality of strip features that are substantially equidistantly arranged in a plane view; while the second pattern structure (e.g., second pattern structure 485) includes a plurality of substantially equidistantly arranged strip features that are projectively obliquely intersecting the first pattern group. In such example, the target pattern has a grid structure having a shorter pitch than that of the first and the second pattern structure.

However, mask (e.g., multi-layered mask 420) profile asymmetry occurs. In the embodiment illustrated in FIG. 33, the remaining second dummy layer 445 (shown in FIG. 32) on the recessed first dummy layer 430' and portions of the recessed first dummy layer 430' (shown in FIG. 32) that was not covered by the remaining second dummy layer 445 are etched concurrently. As such, the recessed first dummy layer 430' has ununiformed thickness. For example, the recessed first dummy layer 430' has a first thickness $T_1$ and a second thickness $T_2$, where $T_1 > T_2$. When the silicon oxide layer 422 and ACL 421 are patterned via the ununiform recessed first dummy layer 430', asymmetry profile occurs. This asymmetry limits the improvement of the uniformity of the final pattern for patterning the recess features for housing the landing pads. In some scenarios, to reduce the asymmetry, the design of the final structure (e.g., the structure/arrangement of the recess features for housing the landing pads) may be changed. However, these changes may require employing massive technical development or many additional steps to the existing fabrication process.

FIGS. 34-38 show exemplary fabrication processes of a semiconductor device in accordance with some embodiments of the instant disclosure. In particular, the FIGS. 34-38 show exemplary fabrication processes of patterning an interlayer dielectric layer (e.g., landing pad insulating layer 260) to form recess features for accommodating landing pads (e.g., landing pads 265) in accordance with some embodiments of the instant disclosure. The illustrative embodiment of the semiconductor device may be, for example, a Dynamic Random Access Memory (DRAM) device. In some embodiments, the fabrication processes illustrated in FIGS. 34-38 may be performed In-Situ. For illustrational simplicity and clarity, some detail/sub-components of the exemplary device are not explicitly labeled in the instant FIGure. For example, structures under an landing pad insulating layer such as substrate, BL stack features, BL contacts are not shown in FIGS. 34-38.

Referring to FIG. 34, an ashing resistive layer 510 and several upper layers are subsequentially disposed over a mask layer (e.g., multi-layered mask 420). The formation of the ashing resistive layer may comprises depositing a ceramic layer to form the ashing resistive layer. For example, the ashing resistive layer (ceramic layer) 510 may comprise silicon oxide nitride. The ceramic layer 510 may have a thickness from about 150 to 300 Å. For example, a thickness of the ashing resistive layer 510 is about 260 Å. In some embodiment, the multi-layered mask 420 (comprising an ACL 421 on a device layer 410, a silicon oxide layer 422 and a spin-on hard mask layer 423) may be fabricated utilizing comparable process and materials of the embodiment previously described in conjunction with FIG. 26. A thickness ratio between the ashing resistive layer and the top most layer of the multi-layered mask 420 (e.g., the spin-on hard mask layer 423) may be in a range from about 0.15 to 0.25. In the illustrative embodiment, a thickness ratio between the ashing resistive layer 510 and the spin-on hard mask layer 423 is about 0.21.

In the illustrated embodiment, the upper layers comprising a dummy stack (e.g., including a first dummy layer 430 and a second dummy layer 440), a first buffer layer 460, a first pattern structure 460 defining a first pattern group, a third dummy layer 470, a second buffer layer 480, and a mask 490 defining a second pattern group. In some embodiment, the upper layers may be fabricated utilizing comparable process and materials of the embodiment previously described in conjunction with FIG. 26. For example, over the ceramic layer, the disposing of the dummy stack comprises sequentially disposing a first dummy layer 430 and a second dummy layer 440 there-above. In some embodiments, the first dummy layer 440 has an ashing resistance greater than that of the second dummy layer 430. For example, the first dummy layer 430 comprises a TEOS layer; while the second dummy layer 440 comprises a SOH layer. A thickness ratio between the ashing resistive layer and the bottom most layer of the dummy stack may be in a range from about 0.5 to 0.8. By ways of example, a thickness ratio between the ashing resistive layer 510 and the first dummy layer 430 is about 0.65.

Referring to FIG. 35, the upper layer (e.g., second dummy layer 440) of the dummy stack is patterned to define the target pattern; while the lower layer (e.g., first dummy layer 430) of the dummy stack is partially exposed. In some embodiments, the patterning of the dummy stack may employ the processes in accordance to the embodiment previously described in conjunction with FIGS. 28 to 30. In the illustrative embodiment, the second dummy layer 440 is recessed to form a recessed second dummy layer 440', wherein the recessed second dummy layer 440' defines the target pattern. Meanwhile, the first dummy layer 430 is partially exposed.

Referring to FIG. 36, the remain portions of the first buffer layer (e.g., the recessed first buffer layer 450) on the recessed second dummy layer 440' and the first pattern structure 460 are recessed such that a target pattern structure 447 is formed. An etching (e.g., anisotropic etching) process is performed through the recessed second dummy layer 440' to recess the exposed portions of the first dummy layer 430 such that the target pattern is transferred to the recessed first dummy layer 430'. Both of the remaining second dummy layer 445 and the recessed first dummy layer 430' defines the target pattern. The remaining second dummy layer 445 and the recessed first dummy layer 430' are collectively referred as to a target pattern structure 447. In the illustrated embodiment, portions of the remaining second dummy layer 445 corresponding to the first pattern group are higher than portions corresponding to the second pattern group. For example, a thickness $T_3$ is larger than thickness $T_4$.

Referring to FIG. 37, an ashing process is performed to reduce the target pattern structure 447. Since the first dummy layer 440 has an ashing resistance greater than that of the second dummy layer 430, the upper portion of the target pattern structure 447 (e.g., the remaining second dummy layer 445 having ununiform thickness) is removed while the patterned lower layer of the target pattern structure 447 (e.g., recessed first dummy layer 430') remains and is exposed. During the ashing process, the ashing resistive layer 510 protects the underlying SOH layer 423, thereby keeping the uniformity of the multi-layered mask 420.

Referring to FIG. 38, performing a pattern transferring process by recessing the ceramic layer 510 and the multi-layered mask 420 through the ashed target pattern structure 447 (the recessed first dummy layer 430') to transfer the target pattern to the multi-layered mask 420. In the illustrated embodiment, the target pattern defined by the recessed first dummy layer 430' is transferred to the spin-on hard mask layer 423.

Later, the device layer 410 may be patterned through the remain portions of the multi-layered mask 420. As such, the target pattern (projectively overlaps with the first and the second pattern group) is transferred to the device layer 410, thereby recess features for housing subsequentially fabricated landing pads are formed penetrating the device layer 410.

Note that the target pattern is transferred to the dummy stack and the ununiform upper portion thereof is then removed via the ashing process, thereby leaving a remaining lower portion of the dummy stack (e.g., the recessed first dummy layer 430') defining the target pattern that possesses a substantially uniform thickness. As such, the multi-layered mask 420 may maintain its uniform thickness during the pattern transferring process via the remaining lower portion of the dummy stack (e.g., the recessed first dummy layer 430'). In the other word, the pattern uniformity is improved compared to the previously described embodiment. Moreover, the final structure (e.g., the structure/arrangement of the recess features for housing the landing pads) does not change. Since the changes in existing processes have been minimized, it is expected to be achievable without additional process technology development.

Accordingly, one aspect of the instant disclosure provides a method. The method comprises: disposing a multi-layered mask over a device layer; disposing an ashing resistive layer over the multi-layered mask; sequentially disposing a first dummy layer and a second dummy layer on the ashing resistive layer, the first dummy layer having higher ashing resistance than the second dummy layer; sequentially forming a first pattern structure that defines a first pattern group over the second dummy layer and a second pattern structure that defines a second pattern group over the first pattern structure, wherein at least a portion of the second pattern structure offsets the first pattern structure; etching the second dummy layer through the first and the second pattern structure thereby forming a target pattern in the recessed second dummy layer; performing an etching process, through the recessed second dummy layer to recess the exposed portions of the first dummy layer, thereby forming a target pattern structure, wherein the ashing resistive layer is partially exposed; performing an ashing process to reduce the target pattern structure such that the recessed first dummy layer is exposed; and performing a pattern transferring process by recessing the ashing resistive layer and the multi-layered mask through the recessed first dummy layer to transfer the target pattern to the multi-layered mask.

In some embodiments, wherein the forming the first and the second pattern structures comprising respectively arranging the first and the second pattern groups in form of segmented pattern components, wherein the first and the second pattern structures do not projectively overlap.

In some embodiments, wherein the forming the first and the second pattern structures comprising respectively arranging the first and the second pattern groups in form of linearly continuous pattern components, wherein the first and the second pattern structures partially projectively overlap.

In some embodiments, the recessed second dummy layer includes an asymmetric cross-sectional profile.

In some embodiments, the forming the first and the second pattern structures comprises: disposing a first buffer layer on the second dummy layer; disposing a pattern layer on the first buffer layer; patterning the pattern layer to form the first pattern structure; disposing, covering the first pattern structure, a third dummy layer having an etching resistance substantially equal to that of the second dummy layer; disposing a second buffer layer on the third dummy layer; and patterning the second buffer layer to form the second pattern structure.

In some embodiments, the recessing the second dummy layer to form the target pattern structure comprises: recessing the third dummy layer through the second pattern structure such that the second pattern group defined by the second pattern structure is transferred to the recessed third dummy layer, wherein the first pattern structure and portions of the first buffer layer are exposed; removing the second pattern structure to expose the recessed third dummy layer; recessing the first buffer layer, through the first pattern structure and the recessed third dummy layer, to partially expose the second dummy layer; recessing the exposed portions of the second dummy layer till the portions of the first dummy layer there-under are exposed, wherein the recessed third dummy layer is removed concurrently such that portions of the first buffer layer there-under are exposed; and recessing the remain portions of the first buffer layer on the recessed second dummy layer and the first pattern structure that partially covers the remain portions of first buffer layer such that the target pattern structure is formed, wherein portions of the target pattern structure corresponding to the first pattern group are higher than portions corresponding to the second pattern group.

In some embodiments, the sequentially forming the first pattern structure and the second pattern structure comprises: disposing a silicon oxide nitride layer to form the first buffer layer; and disposing a silicon oxide nitride layer to form the second buffer layer.

In some embodiments, the disposing the pattern layer comprises: performing an atomic layer deposition to form the pattern layer, wherein the pattern layer comprises silicon oxide.

In some embodiments, the disposing the first dummy layer comprises: disposing a TEOS layer to form the first dummy layer.

In some embodiments, a thickness ratio between the ashing resistive layer and the first dummy layer is in a range from about 0.5 to 0.8.

In some embodiments, a thickness ratio between the first dummy layer and the second dummy layer is in a range from about 0.3 to 0.5.

In some embodiments, the disposing the ashing resistive layer comprises depositing a ceramic material to form the ashing resistive layer.

In some embodiments, the disposing the multi-layered mask comprises: disposing an amorphous carbon layer on the device layer; disposing a silicon oxide layer on the amorphous carbon layer; and performing a spin-on process to form a spin-on hard mask layer on the silicon oxide layer.

In some embodiments, the disposing a silicon oxide layer on the amorphous carbon layer comprises performing an atomic layer deposition to form the silicon oxide layer.

In some embodiments, the performing the pattern transferring process comprises: recessing the spin-on hard mask layer of the multi-layered mask through the recessed first dummy layer to transfer the target pattern to the spin-on hard mask layer.

Accordingly, one aspect of the instant disclosure provides a method. The method comprises: disposing a ceramic layer over a mask layer; disposing a dummy stack on the ceramic layer, wherein an upper portion of the dummy stack includes spin-on hard mask material; sequentially forming a first pattern structure defining a first pattern group over the dummy stack and a second pattern structure defining a second pattern group over the first pattern structure; etching the dummy stack through the first pattern structure and the second pattern structure, thereby forming a target pattern structure, wherein the ceramic layer is partially exposed; performing an ashing process to remove the upper portion of the target pattern structure; and performing a pattern transferring process via recessing the ceramic layer and the mask layer through the ashed target pattern structure to transfer the target pattern to the mask layer.

In some embodiments of the instant disclosure, the disposing the ceramic layer comprises depositing the ceramic layer to a thickness in a range from about 150 to 300 nm.

In some embodiments of the instant disclosure, the disposing the dummy stack comprises: disposing a TEOS layer on the ceramic layer; and disposing a spin-on hard mask layer on the TEOS layer.

In some embodiments of the instant disclosure, forming the first and the second pattern structures comprising respectively arranging the first and the second pattern groups in form of linearly continuous pattern components, wherein the first and the second pattern structures partially projectively overlap.

In some embodiments of the instant disclosure, wherein the target pattern structure includes an asymmetric cross-sectional profile.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:
1. A method, comprising:
disposing a multi-layered mask over a device layer;
disposing an ashing resistive layer over the multi-layered mask;
sequentially disposing a first dummy layer and a second dummy layer on the ashing resistive layer, the first dummy layer having higher ashing resistance than the second dummy layer;
sequentially forming a first pattern structure that defines a first pattern group over the second dummy layer and a second pattern structure that defines a second pattern group above the first pattern structure, wherein at least a portion of the second pattern structure projectively offsets the first pattern structure;
recessing the second dummy layer through the first and the second pattern structures to partially expose the first dummy layer, thereby forming a target pattern in the recessed second dummy layer;

performing an etching process through the recessed second dummy layer to recess the exposed portions of the first dummy layer, thereby forming a target pattern structure, wherein the ashing resistive layer is partially exposed;

performing an ashing process to reduce the target pattern structure such that the recessed first dummy layer is exposed; and performing a pattern transferring process by recessing the ashing resistive layer and the multi-layered mask through the recessed first dummy layer to transfer the target pattern to the multi-layered mask.

2. The method of claim 1, wherein the forming the first and the second pattern structures comprising respectively arranging the first and the second pattern groups in form of segmented pattern components, wherein the first and the second pattern structures do not projectively overlap.

3. The method of claim 1, wherein the forming the first and the second pattern structures comprising respectively arranging the first and the second pattern groups in form of linearly continuous pattern components, wherein the first and the second pattern structures partially projectively overlap.

4. The method of claim 1, wherein the recessed second dummy layer comprises an asymmetric cross-sectional profile.

5. The method of claim 1, wherein
a thickness ratio between the ashing resistive layer and the first dummy layer is in a range from about 0.5 to 0.8.

6. The method of claim 1, wherein
a thickness ratio between the first dummy layer and the second dummy layer is in a range from about 0.3 to 0.5.

7. The method of claim 1,
wherein the disposing the ashing resistive layer comprises depositing a ceramic material to form the ashing resistive layer.

8. The method of claim 1, wherein the disposing the multi-layered mask comprises:
disposing an amorphous carbon layer on the device layer;
disposing a silicon oxide layer on the amorphous carbon layer; and
performing a spin-on process to form a spin-on hard mask layer on the silicon oxide layer.

9. The method of claim 8,
wherein the disposing a silicon oxide layer on the amorphous carbon layer comprises
performing an atomic layer deposition to form the silicon oxide layer.

10. The method of claim 8,
wherein the performing the pattern transferring process comprises
recessing the spin-on hard mask layer of the multi-layered mask through the recessed first dummy layer to transfer the target pattern to the spin-on hard mask layer.

11. The method of claim 1, wherein the forming the first and the second pattern structures comprises disposing a first buffer layer on the second dummy layer;
disposing a pattern layer on the first buffer layer;
patterning the pattern layer to form the first pattern structure;
disposing, covering the first pattern structure, a third dummy layer having an etching resistance substantially equal to that of the second dummy layer;
disposing a second buffer layer on the third dummy layer; and
patterning the second buffer layer to form the second pattern structure.

12. The method of claim 11, wherein the recessing the second dummy layer to form the target pattern structure comprises
recessing the third dummy layer through the second pattern structure such that the second pattern group defined by the second pattern structure is transferred to the recessed third dummy layer, wherein the first pattern structure and portions of the first buffer layer are exposed;
removing the second pattern structure to expose the recessed third dummy layer;
recessing the first buffer layer, through the first pattern structure and the recessed third dummy layer, to partially expose the second dummy layer;
recessing the exposed portions of the second dummy layer till the portions of the first dummy layer there-under are exposed, wherein the recessed third dummy layer is removed concurrently such that portions of the first buffer layer there-under are exposed; and
recessing the remain portions of the first buffer layer on the recessed second dummy layer and recessing the first pattern structure that partially covers the remain portions of first buffer layer such that the target pattern structure is formed, wherein portions of the target pattern structure corresponding to the first pattern group are higher than portions corresponding to the second pattern group.

13. The method of claim 11,
wherein the sequentially forming the first pattern structure and the second pattern structure comprises
disposing a silicon oxide nitride layer to form the first buffer layer; and
disposing a silicon oxide nitride layer to form the second buffer layer.

14. The method of claim 11, wherein the disposing the pattern layer comprises
performing an atomic layer deposition to form the pattern layer, wherein the pattern layer comprises silicon oxide.

15. The method of claim 11, wherein the disposing the first dummy layer comprises
disposing a TEOS layer to form the first dummy layer.

16. A method, comprising:
disposing a ceramic layer over a mask layer;
disposing a dummy stack on the ceramic layer, wherein an upper portion of the dummy stack comprises spin-on hard mask material;
sequentially forming a first pattern structure that defines a first pattern group over the dummy stack and a second pattern structure that defines a second pattern group over the first pattern structure;
recessing the dummy stack, through the first pattern structure and the second pattern structure, thereby forming a target pattern structure, wherein the target pattern structure comprises an asymmetric cross-sectional profile, the ceramic layer is partially exposed;
performing an ashing process to remove the upper portion of the target pattern structure; and
performing a pattern transferring process via recessing the ceramic layer and the mask layer through the ashed target pattern structure to transfer the target pattern to the mask layer.

17. The method of claim 16, wherein the disposing the ceramic layer comprises depositing the ceramic layer to a thickness in a range from about 150 to 300 nm.

18. The method of claim 16,
wherein the disposing the dummy stack comprises
disposing a TEOS layer on the ceramic layer; and
disposing a spin-on hard mask layer on the TEOS layer.

19. The method of claim 16, wherein forming the first and the second pattern structures comprising respectively arranging the first and the second pattern groups in form of linearly continuous pattern components, wherein the first and the second pattern structures partially projectively overlap.

\* \* \* \* \*